US 7,204,722 B2

(12) United States Patent
Hashim et al.

(10) Patent No.: US 7,204,722 B2
(45) Date of Patent: Apr. 17, 2007

(54) COMMUNICATIONS JACK WITH COMPENSATION FOR DIFFERENTIAL TO DIFFERENTIAL AND DIFFERENTIAL TO COMMON MODE CROSSTALK

(75) Inventors: Amid Hashim, Plano, TX (US); Robert Ray Goodrich, Indianapolis, IN (US)

(73) Assignee: CommScope Solutions Properties, LLC, Sparks, NV (US)

( * ) Notice: Subject to any disclaimer, the term of this patent is extended or adjusted under 35 U.S.C. 154(b) by 0 days.

(21) Appl. No.: 11/088,044

(22) Filed: Mar. 23, 2005

(65) Prior Publication Data

US 2006/0160428 A1   Jul. 20, 2006

Related U.S. Application Data

(60) Provisional application No. 60/636,595, filed on Dec. 16, 2004.

(51) Int. Cl.
*H01R 24/00* (2006.01)
*H01R 13/625* (2006.01)

(52) U.S. Cl. .................. 439/676; 439/941; 439/344
(58) Field of Classification Search ................ 439/676, 439/344, 941, 76.1
See application file for complete search history.

(56) References Cited

U.S. PATENT DOCUMENTS

| 5,186,647 | A | 2/1993 | Denkmann et al. |
|---|---|---|---|
| 5,299,956 | A | 4/1994 | Brownell et al. |
| 5,310,363 | A | 5/1994 | Brownell et al. |
| 5,326,284 | A | 7/1994 | Bohbot et al. |
| 5,328,390 | A | 7/1994 | Johnston et al. |
| 5,362,257 | A | 11/1994 | Neal et al. |
| 5,397,862 | A | 3/1995 | Bockelman et al. |
| 5,414,393 | A | 5/1995 | Rose et al. |
| 5,432,484 | A | 7/1995 | Klas et al. |
| 5,547,405 | A | 8/1996 | Pinney et al. |
| 5,571,035 | A | 11/1996 | Ferrill |
| 5,587,884 | A | 12/1996 | Raman |
| 5,618,185 | A | 4/1997 | Aekins |

(Continued)

FOREIGN PATENT DOCUMENTS

EP   0 525 703 B1   2/1993

(Continued)

OTHER PUBLICATIONS

Belden CDT Networking Data Sheet for the 10GX Module www.BeldenIBDN.com.

*Primary Examiner*—Hien Vu
(74) *Attorney, Agent, or Firm*—Myers Bigel Sibley & Sajovec

(57) ABSTRACT

A communications jack assembly includes: a jack frame having a plug aperture; a dielectric mounting substrate attached to the jack frame; and a plurality of conductors engaged with the mounting substrate, each of the conductors including a fixed end portion mounted with the mounting substrate and a free end portion extending into the plug aperture for electrical contact with a mating plug, each of the free end portions having substantially the same profile and being substantially transversely aligned in side-by-side relationship. A first pair of conductors is sandwiched inside a second pair of conductors. The second pair of conductors includes a crossover, the positioning of crossover being selected to provide differential to common mode crosstalk compensation.

30 Claims, 18 Drawing Sheets

U.S. PATENT DOCUMENTS

| | | | |
|---|---|---|---|
| 5,779,503 A | 7/1998 | Tremblay et al. | |
| 5,911,602 A | 6/1999 | Vaden | |
| 5,915,989 A | 6/1999 | Adriaenssens et al. | |
| 5,921,818 A * | 7/1999 | Larsen et al. | 439/676 |
| 5,947,772 A | 9/1999 | Arnett et al. | |
| 5,961,354 A | 10/1999 | Hashim | |
| 5,967,853 A | 10/1999 | Hashim | |
| 5,971,813 A | 10/1999 | Kunz et al. | |
| 5,975,919 A | 11/1999 | Arnett et al. | |
| 5,989,071 A | 11/1999 | Larsen et al. | |
| 5,997,358 A | 12/1999 | Adriaenssens et al. | |
| 6,017,247 A | 1/2000 | Gwiazdowski | |
| 6,042,427 A | 3/2000 | Adriaenssens et al. | |
| 6,050,843 A | 4/2000 | Adriaenssens et al. | |
| 6,102,730 A | 8/2000 | Kjeldahl et al. | |
| 6,116,964 A | 9/2000 | Goodrich et al. | |
| 6,120,330 A | 9/2000 | Gwiazdowski | |
| 6,165,023 A | 12/2000 | Troutman et al. | |
| 6,170,154 B1 | 1/2001 | Swarup | |
| 6,186,834 B1 * | 2/2001 | Arnett et al. | 439/676 |
| 6,196,880 B1 * | 3/2001 | Goodrich et al. | 439/676 |
| 6,238,235 B1 | 5/2001 | Shavit et al. | |
| 6,270,358 B1 | 8/2001 | Nozick | |
| 6,270,381 B1 | 8/2001 | Adriaenssens et al. | |
| 6,312,290 B1 * | 11/2001 | Belopolsky | 439/676 |
| 6,350,158 B1 | 2/2002 | Arnett et al. | |
| 6,353,540 B1 | 3/2002 | Akiba et al. | |
| 6,356,162 B1 | 3/2002 | DeFlandre et al. | |
| 6,364,694 B1 * | 4/2002 | Lien | 439/489 |
| 6,379,157 B1 | 4/2002 | Curry et al. | |
| 6,379,198 B1 | 4/2002 | Arnett et al. | |
| 6,407,542 B1 | 6/2002 | Conte | |
| 6,428,362 B1 | 8/2002 | Phommachanh | |
| 6,443,776 B2 | 9/2002 | Reichle | |
| 6,443,777 B1 | 9/2002 | McCurdy et al. | |
| 6,454,541 B1 | 9/2002 | Ijiri et al. | |
| 6,464,529 B1 * | 10/2002 | Jensen et al. | 439/405 |
| 6,520,807 B2 | 2/2003 | Winings | |
| 6,524,128 B2 | 2/2003 | Marowsky et al. | |
| 6,530,810 B2 | 3/2003 | Goodrich | |
| 6,558,204 B1 | 5/2003 | Weatherley | |
| 6,558,207 B1 * | 5/2003 | Pepe et al. | 439/862 |
| 6,561,838 B1 | 5/2003 | Blichfeldt | |
| 6,571,187 B1 | 5/2003 | Conte | |
| 6,592,395 B2 | 7/2003 | Brown et al. | |
| 6,647,357 B1 | 11/2003 | Conte | |
| 6,716,964 B1 | 4/2004 | Chinnadurai | |
| 6,764,348 B2 | 7/2004 | Han et al. | |
| 6,811,442 B1 | 11/2004 | Lien et al. | |
| 6,962,503 B2 | 11/2005 | Aekins | |
| 2001/0018287 A1 * | 8/2001 | Reichle | 439/374 |
| 2001/0021608 A1 * | 9/2001 | Borbolla et al. | 439/676 |
| 2001/0048592 A1 | 12/2001 | Nimomiya | |
| 2002/0088977 A1 | 7/2002 | Mori et al. | |
| 2003/0129880 A1 | 7/2003 | Arnett et al. | |
| 2004/0002267 A1 * | 1/2004 | Hatterscheid et al. | 439/676 |
| 2005/0254223 A1 | 11/2005 | Hashim | |
| 2006/0121788 A1 | 6/2006 | Pharmey | |
| 2006/0121789 A1 | 6/2006 | Hashim | |
| 2006/0160428 A1 | 7/2006 | Hashim | |

FOREIGN PATENT DOCUMENTS

| | | |
|---|---|---|
| EP | 0 901 201 | 3/1999 |
| EP | 1 059 704 | 12/2000 |
| EP | 1 191 646 | 3/2002 |
| EP | 1 435 679 | 7/2004 |
| WO | WO 94/05092 | 3/1994 |
| WO | WO 99/53574 | 10/1999 |
| WO | WO 2003-019734 | 3/2003 |
| WO | WO 03/090322 | 10/2003 |

* cited by examiner

US 7,204,722 B2

COMMUNICATIONS JACK WITH COMPENSATION FOR DIFFERENTIAL TO DIFFERENTIAL AND DIFFERENTIAL TO COMMON MODE CROSSTALK

RELATED APPLICATIONS

This application claims priority to U.S. Provisional Patent Application Ser. No. 60/636,595, filed Dec. 16, 2004, entitled CROSSOVER FOR SIMULTANEOUSLY COMPENSATING DIFFERENTIAL TO DIFFERENTIAL OR DIFFERENTIAL TO COMMON MODE CROSSTALK, the disclosure of which is hereby incorporated herein in its entirety.

FIELD OF THE INVENTION

The present invention relates generally to communication connectors and more particularly to near-end crosstalk (NEXT) and far-end crosstalk (FEXT) compensation in communication connectors.

BACKGROUND OF THE INVENTION

In an electrical communication system, it is sometimes advantageous to transmit information signals (video, audio, data) over a pair of wires (hereinafter "wire-pair" or "differential pair") rather than a single wire, wherein the transmitted signal comprises the voltage difference between the wires without regard to the absolute voltages present. Each wire in a wire-pair is susceptible to picking up electrical noise from sources such as lightning, automobile spark plugs and radio stations to name but a few. Because this type of noise is common to both wires within a pair, the differential signal is typically not disturbed. This is a fundamental reason for having closely spaced differential pairs.

Of greater concern, however, is the electrical noise that is picked up from nearby wires or pairs of wires that may extend in the same general direction for some distances and not cancel differentially on the victim pair. This is referred to as crosstalk. Particularly, in a communication system involving networked computers, channels are formed by cascading plugs, jacks and cable segments. In such channels, a modular plug often mates with a modular jack, and the proximities and routings of the electrical wires (conductors) and contacting structures within the jack and/or plug also can produce capacitive as well as inductive couplings that generate near-end crosstalk (NEXT) (i.e., the crosstalk measured at an input location corresponding to a source at the same location) as well as far-end crosstalk (FEXT) (i.e., the crosstalk measured at the output location corresponding to a source at the input location). Such crosstalks occur from closely-positioned wires over a short distance. In all of the above situations, undesirable signals are present on the electrical conductors that can interfere with the information signal. When the same noise signal is added to each wire in the wire-pair, the voltage difference between the wires will remain about the same and differential cross-talk is not induced, while at the same time the average voltage on the two wires with respect to ground reference is elevated and common mode crosstalk is induced. On the other hand, when an opposite but equal noise signal is added to each wire in the wire pair, the voltage difference between the wires will be elevated and differential crosstalk is induced, while the average voltage on the two wires with respect to ground reference is not elevated and common mode crosstalk is not induced.

U.S. Pat. No. 5,997,358 to Adriaenssens et al. (hereinafter "the '358 patent") describes a two-stage scheme for compensating differential to differential NEXT for a plug-jack combination (the entire contents of the '358 patent are hereby incorporated herein by reference, as are U.S. Pat. Nos. 5,915,989; 6,042,427; 6,050,843; and 6,270,381). Connectors described in the '358 patent can reduce the internal NEXT (original crosstalk) between the electrical wire pairs of a modular plug by adding a fabricated or artificial crosstalk, usually in the jack, at one or more stages, thereby canceling or reducing the overall crosstalk for the plug-jack combination. The fabricated crosstalk is referred to herein as a compensation crosstalk. This idea can often be implemented by twice crossing the path of one of the differential pairs within the connector relative to the path of another differential pair within the connector, thereby providing two stages of NEXT compensation. This scheme can be more efficient at reducing the NEXT than a scheme in which the compensation is added at a single stage, especially when the second and subsequent stages of compensation include a time delay that is selected to account for differences in phase between the offending and compensating crosstalk. This type of arrangement can include capacitive and/or inductive elements that introduce multi-stage crosstalk compensation, and is typically employed in jack lead frames and PWB structures within jacks. These configurations can allow connectors to meet "Category 6" performance standards set forth in ANSI/EIA/TIA 568, which are primary component standards for mated plugs and jacks for transmission frequencies up to 250 MHz.

Alien NEXT is the differential crosstalk that occurs between communication channels. Obviously, physical separation between jacks will help and/or typical crosstalk approaches may be employed. However, a problem case may be "pair 3" of one channel crosstalking to "pair 3" of another channel, even if the pair 3 plug and jack wires in each channel are remote from each other and the only coupling occurs between the routed cabling. To reduce this form of alien NEXT, shielded systems containing shielded twisted pairs or foiled twisted pair configurations may be used. However, the inclusion of shields can increase cost of the system. Another approach to reduce or minimize alien NEXT utilizes spatial separation of cables within a channel and/or spatial separation between the jacks in a channel. However, this is typically impractical because bundling of cables and patch cords is common practice due to "real estate" constraints and ease of wire management.

In spite of recent strides made in improving mated connector (i.e., plug-jack) performance, and in particular reducing crosstalk at elevated frequencies (e.g., 500 MHz—see U.S. patent application Ser. No. 10/845,104, entitled NEXT High Frequency Improvement by Using Frequency Dependent Effective Capacitance, filed May 4, 2004, the disclosure of which is hereby incorporated herein by reference), channels utilizing connectors that rely on either these teachings or those of the '358 patent can still exhibit unacceptably high alien NEXT at very high frequencies (e.g., 500 MHz). As such, it would be desirable to provide connectors and channels used thereby with reduced alien NEXT at very high frequencies.

SUMMARY OF THE INVENTION

The present invention can provide communications jacks with improved differential to common mode and differential to differential NEXT and FEXT performance, particularly at high frequencies. As a first aspect, embodiments of the present invention are directed to a wiring board for a communications jack, comprising: a dielectric mounting substrate; and a plurality of contact wires mounted in the mounting substrate, each of the contact wires including a fixed end portion mounted in the mounting substrate and a free end portion, each of the free end portions having substantially the same profile and being substantially transversely aligned in side-by-side relationship. A first pair of contact wires is sandwiched inside a second pair of contact wires. The second pair of contact wires includes a crossover, the positioning of crossover being selected to provide differential to common mode crosstalk compensation.

As a second aspect, embodiments of the present invention are directed to a wiring board for a communications jack, comprising: a dielectric mounting substrate; and first, second, third and fourth pairs of contact wires mounted in the mounting substrate, each of the contact wires including a fixed end portion mounted in the mounting substrate and a free end portion, each of the free end portions having substantially the same profile and being substantially transversely aligned in side-by-side relationship. The wires of the first pair of contact wires are immediately adjacent to each other and are sandwiched inside the third pair of contact wires, the wires of the second pair are immediately adjacent to each other, the wires of the fourth pair are immediately adjacent to each other, and the second and fourth pairs sandwich the third pair. The third pair of contact wires includes a crossover, the positioning of crossover being selected to provide differential to common mode crosstalk compensation.

As a third aspect, embodiments of the present invention are directed to a communications jack assembly, comprising: a jack frame having a plug aperture; a dielectric mounting substrate attached to the jack frame; and a plurality of conductors engaged with the mounting substrate, each of the conductors including a fixed end portion mounted with the mounting substrate and a free end portion extending into the plug aperture for electrical contact with a mating plug, each of the free end portions having substantially the same profile and being substantially transversely aligned in side-by-side relationship. A first pair of conductors is sandwiched inside a second pair of conductors. The second pair of conductors includes a crossover, the positioning of crossover being selected to provide differential to common mode crosstalk compensation.

DETAILED DESCRIPTION OF EMBODIMENTS OF THE INVENTION

Figure 1:
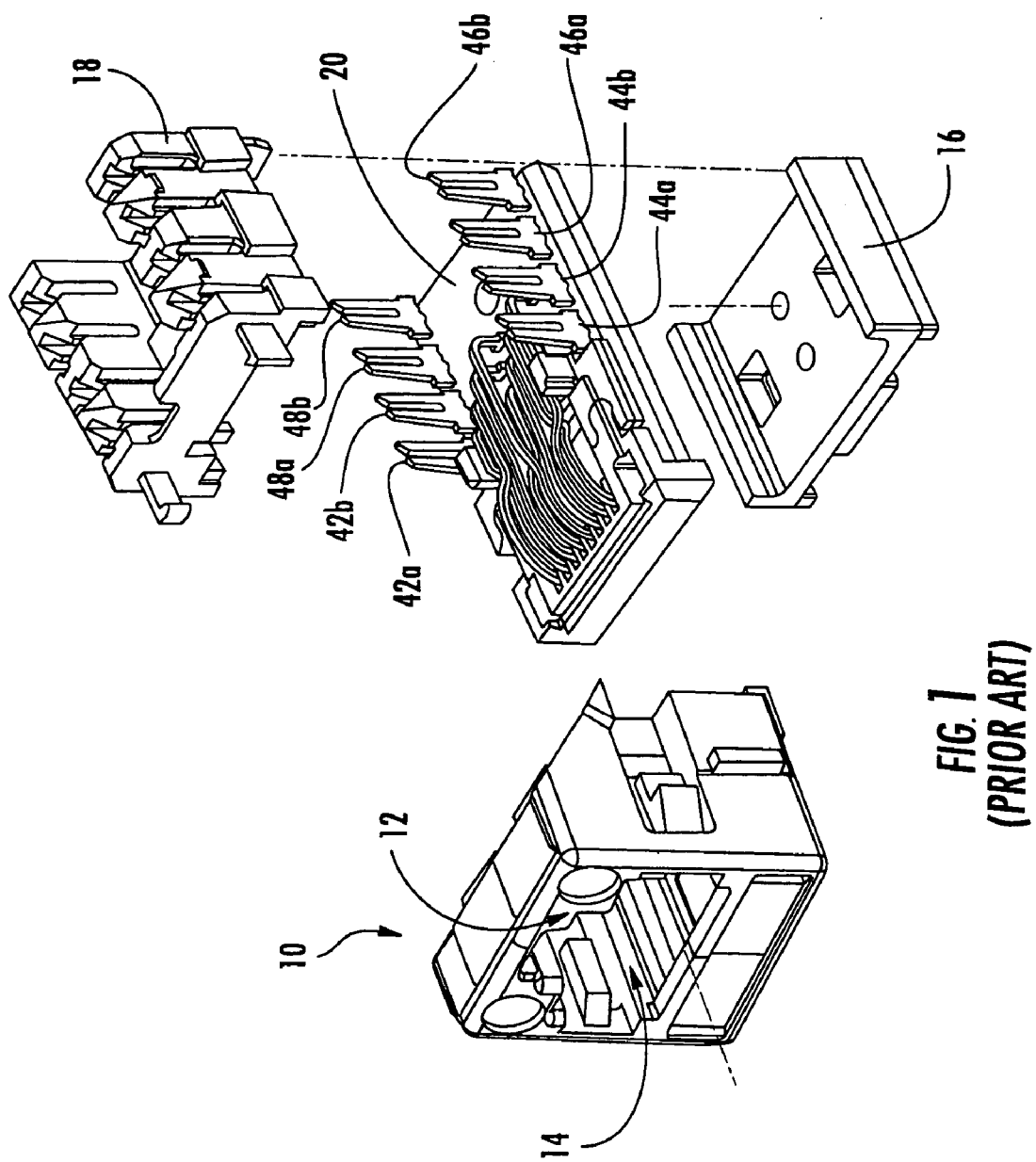
FIG. 1 is an exploded perspective view of a prior art communications jack.

The present invention will be described more particularly hereinafter with reference to the accompanying drawings. The invention is not intended to be limited to the illustrated embodiments; rather, these embodiments are intended to fully and completely disclose the invention to those skilled in this art. In the drawings, like numbers refer to like elements throughout. Thicknesses and dimensions of some components may be exaggerated for clarity.

Unless otherwise defined, all technical and scientific terms used herein have the same meaning as commonly understood by one of ordinary skill in the art to which this invention belongs. The terminology used in the description of the invention herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise. As used herein, the term "and/or" includes any and all combinations of one or more of the associated listed items.

This invention is directed to communications connectors, with a primary example of such being a communications jack. As used herein, the terms "forward", "forwardly", and "front" and derivatives thereof refer to the direction defined by a vector extending from the center of the jack toward the plug opening of the jack. Conversely, the terms "rearward", "rearwardly", and derivatives thereof refer to the direction directly opposite the forward direction; the rearward direction is defined by a vector that extends away from the plug opening toward the remainder of the jack. The terms "lateral," "laterally", and derivatives thereof refer to the direction generally parallel with the plane defined by a wiring board on which jack contact wires are mounted and extending away from a plane bisecting the plug in the center. The terms "medial," "inward," "inboard," and derivatives thereof refer to the direction that is the converse of the lateral direction, i.e., the direction parallel with the plane defined by the wiring board and extending from the periphery of the jack toward the aforementioned bisecting plane. Where used, the terms "attached", "connected", "interconnected", "contacting", "mounted" and the like can mean either direct or indirect attachment or contact between elements, unless stated otherwise. Where used, the terms "coupled," "induced" and the like can mean non-conductive interaction, either direct or indirect, between elements or between different sections of the same element, unless stated otherwise.

Figure 1A:
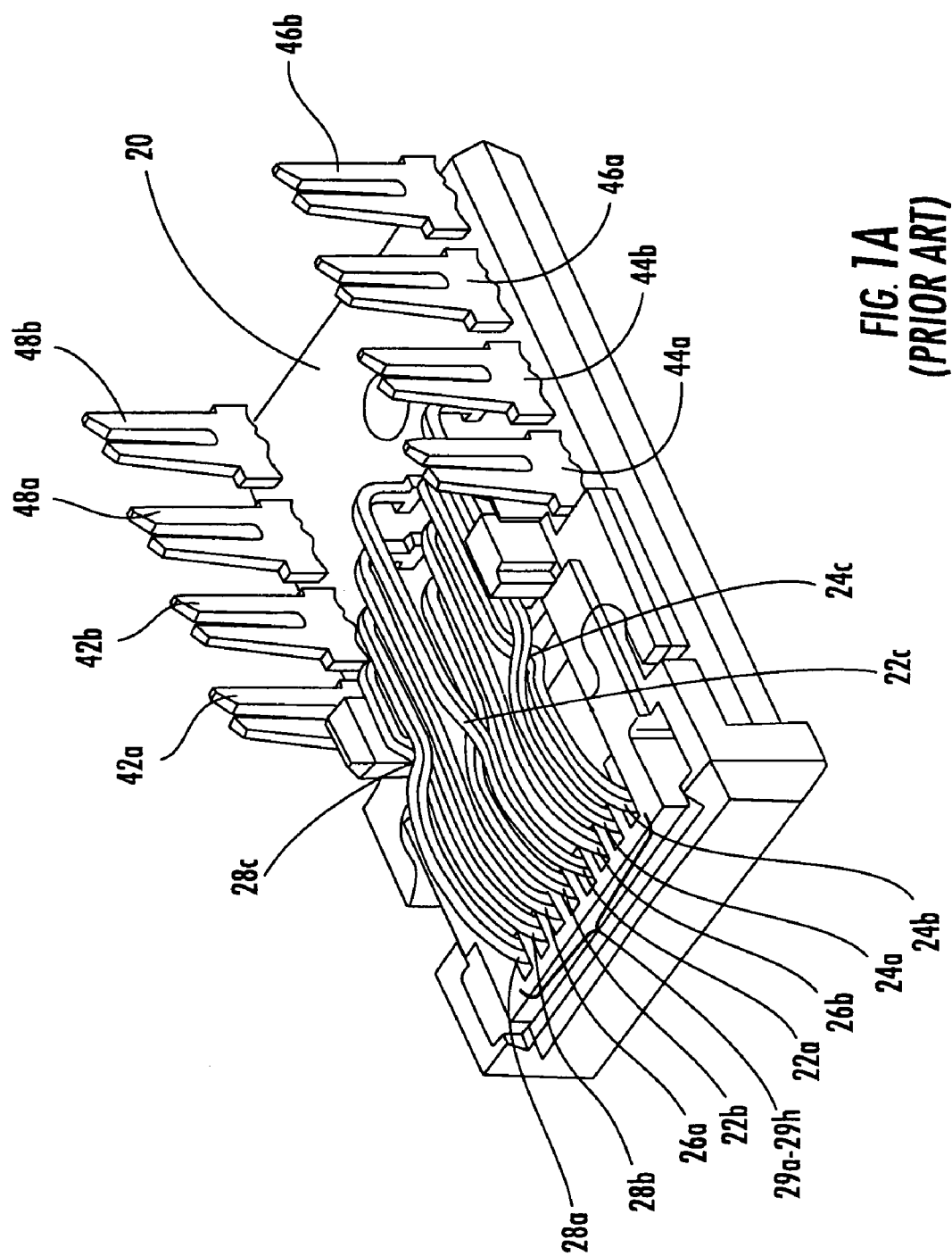
FIG. 1A is an enlarged perspective view of the prior art communications jack of FIG. 1.

Referring now to the figures, a prior art jack, designated broadly at 10, is illustrated in FIGS. 1 and 1A. The jack 10 includes a jack frame 12 having a plug aperture 14 for receiving a mating plug, a cover 16 and a terminal housing 18. These components are conventionally formed and not need be described in detail herein; for a further description of these components and the manner in which they interconnect, see U.S. Pat. No. 6,350,158 to Arnett et al., the disclosure of which is hereby incorporated herein in its entirety. Those skilled in this art will recognize that other configurations of jack frames, covers and terminal housings may also be employed with the present invention. Exemplary configurations are illustrated in U.S. Pat. Nos. 5,975,919 and 5,947,772 to Arnett et al. and U.S. Pat. No. 6,454,541 to Hashim et al., the disclosure of each of which is hereby incorporated herein in its entirety.

Figure 2:
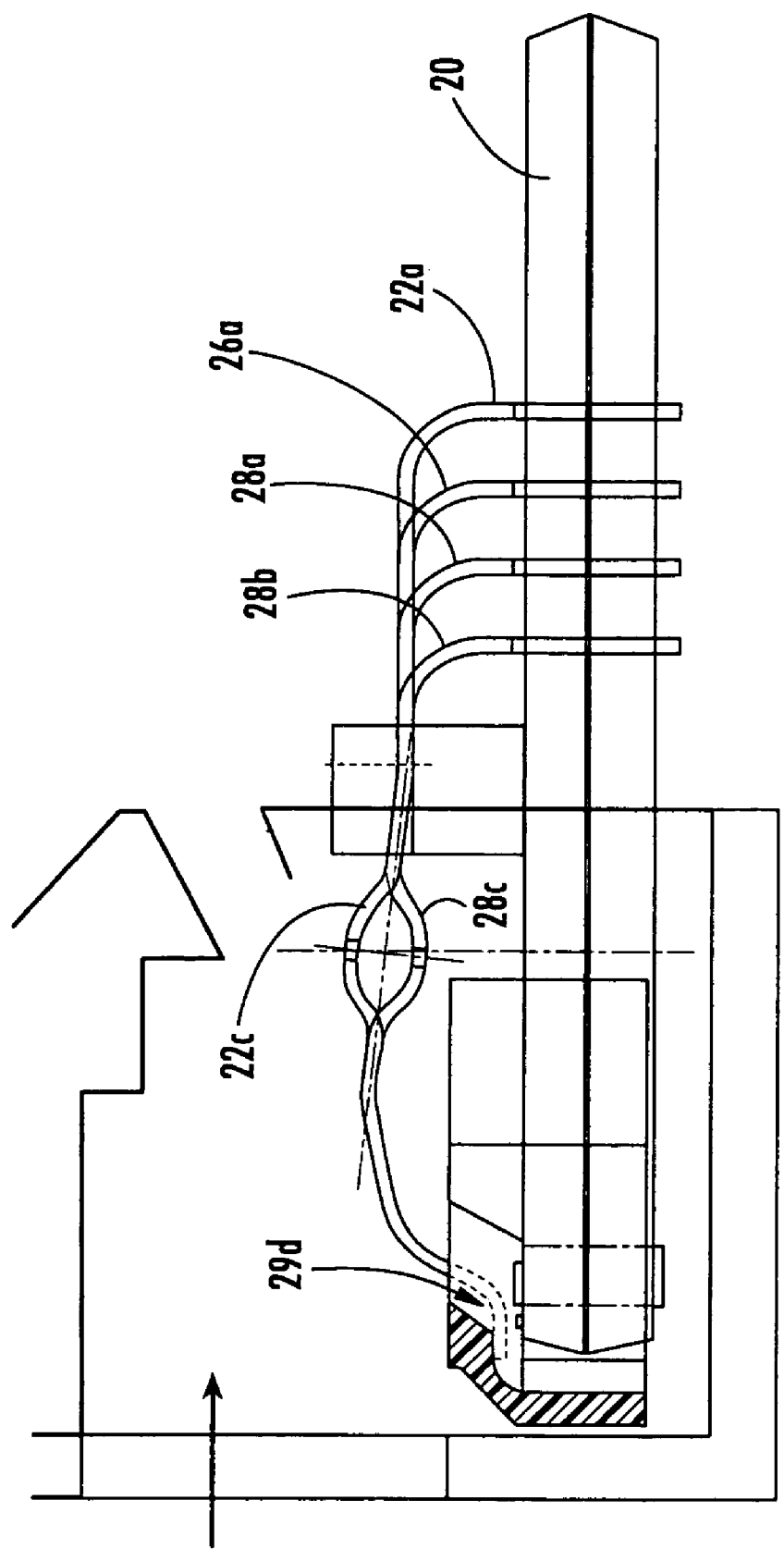
FIG. 2 is a side view of contact wires of the jack of FIG. 1.

In addition, referring still to FIG. 1 and also to FIG. 2, the jack 10 further includes a wiring board 20 formed of conventional materials. The wiring board 20 may be a single layer board or may have multiple layers. The wiring board 20 may be substantially planar as illustrated, or may be non-planar.

Referring again to FIGS. 1 and 1A, contact wires 22a, 22b, 24a, 24b, 26a, 26b, 28a, 28b are attached to the wiring board 20. As described in U.S. Pat. No. 6,350,158 referenced above, the contact wires 22a, 22b, 24a, 24b, 26a, 26b, 28a, 28b have free ends that have substantially the same profile, are substantially transversely aligned in side-by-side relationship, and that extend into the plug aperture 14 to form electrical contact with the terminal blades of a mating plug. The free ends of the contact wires 22a, 22b, 24a, 24b, 26a, 26b, 28a, 28b extend into individual slots 29a–29h in the forward edge portion of the wiring board 20. The contact wires 22a, 22b, 24a, 24b, 26a, 26b, 28a, 28b are arranged in pairs defined by TIA 568B, with wires 22a, 22b (pair 1) being adjacent to each other and in the center of the sequence of wires, wires 24a, 24b (pair 2) being adjacent to each other and occupying the leftmost two positions (from the vantage point of FIG. 1B) in the sequence, wires 28a, 28b (pair 4) being adjacent to each other and occupying the rightmost two positions (from the vantage point of FIG. 1B) in the sequence, and wires 26a, 26b (pair 3) being positioned between, respectively, pairs 1 and 4 and pairs 1 and 2. The wires 22a, 22b, 24a, 24b, 26a, 26b, 28a, 28b are mounted to the wiring board 20 via insertion into respective apertures 32a, 32b, 34a, 34b, 36a, 36b, 38a, 38b, which are arranged in the illustrated embodiment in a "dual diagonal" pattern known to those skilled in this art as described in U.S. Pat. No. 6,196,880 to Goodrich et al., the disclosure of which is hereby incorporated herein in its entirety. Those skilled in this art will appreciate that contact wires or other contacts of other configurations may be used. As one example, contact wires configured as described in aforementioned U.S. Pat. No. 5,975,919 to Arnett et al. may be employed.

Figure 3:
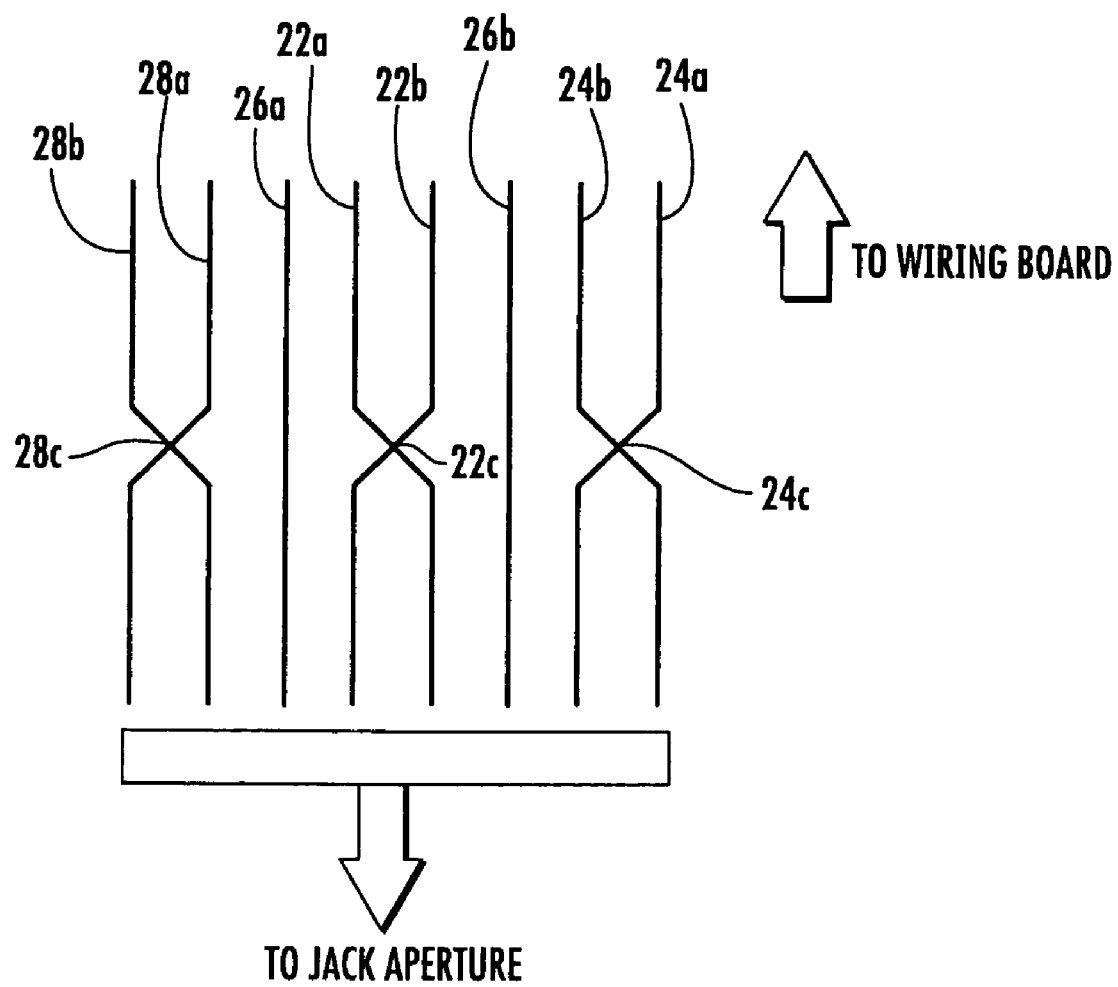
FIG. 3 is a top schematic view of contact wires of the prior art jack of FIG. 1.

As can be seen in FIGS. 1A and 3, each of pairs 1, 2 and 4 that comprise adjacent contact wires include a respective "crossover" 22c, 24c, 28c, i.e., a location in which the contact wires of a pair cross each other without making electrical contact, typically such that the free end of one contact wire of the pair is substantially longitudinally aligned with the fixed end portion of the other contact wire of the pair. The crossovers 22c, 24c, 28c are located approximately in the center of their contact wires (between the free ends of the contact wires and their mounting locations on the wiring board 20). Crossovers are included to provide compensatory crosstalk between contact wires. In the illustrated embodiment, the crossovers are implemented via complementary localized bends in the crossing wires, with one wire being bent upwardly and the other wire being bent downwardly. The presence of a crossover, structural implementations thereof, and its effect on crosstalk are discussed in some detail in the '358 patent described above and U.S. Pat. No. 5,186,647 to Denkmann et al., the disclosure of which is hereby incorporated herein by reference. In this prior art device, the contact wires of pair 3 (wires 26a, 26b) do not include a crossover.

Figure 1B:
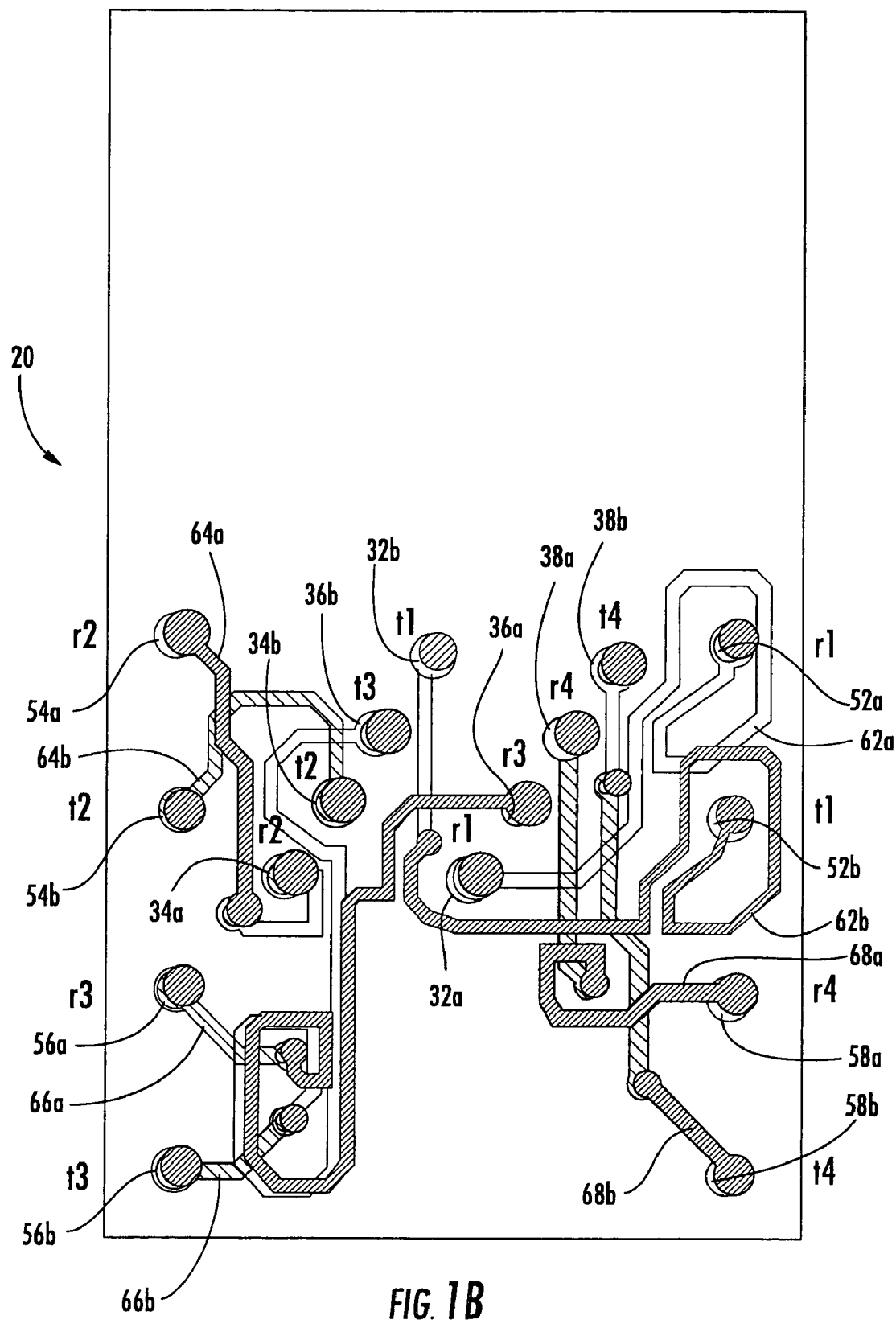
FIG. 1B is a top view of the wiring board of FIG. 1A.

Referring once again to FIGS. 1 and 1A and to FIG. 1B, eight insulation displacement connectors (IDCs) 42a, 42b, 44a, 44b, 46a, 46b, 48a, 48b are inserted into eight respective IDC apertures 52a, 52b, 54a, 54b, 56a, 56b, 58a, 58b. The IDCs are of conventional construction and need not be described in detail herein; exemplary IDCs are illustrated and described in U.S. Pat. No. 5,975,919 to Arnett, the disclosure of which is hereby incorporated by reference herein in its entirety.

Referring now to FIGS. 1A, 1B and 2, the each of the wire apertures 32a, 32b, 34a, 34b, 36a, 36b, 38a, 38b is electrically connected to a respective IDC aperture 52a, 52b, 54a, 54b, 56a, 56b, 58a, 58b via a respective conductor 62a, 62b, 64a, 64b, 66a, 66b, 68a, 68b, thereby interconnecting each of the contact wires 22a, 22b, 24a, 24b, 26a, 26b, 28a, 28b to its corresponding IDC 42a, 42b, 44a, 44b, 46a, 46b, 48a, 48b. The conductors 62a, 62b, 64a, 64b, 66a, 66b, 68a, 68b are formed of conventional conductive materials and are deposited on the wiring board 20 via any deposition method known to those skilled in this art to be suitable for the application of conductors. Some conductors are illustrated as being entirely present on a single layer of the wiring board 20 (for example, conductor 62a), while other conductors (for example, conductor 62b) may reside on multiple layers of the wiring board 20; conductors can travel between layers through the inclusion of vias (also known as plated through holes) or other layer-transferring structures known to those skilled in this art.

U.S. Pat. No. 5,967,853 to Hashim (the disclosure of which is hereby incorporated herein in its entirety) describes a technique whereby capacitive compensation is used to simultaneously compensate differential to differential and differential to common mode crosstalk. However, in order to effectively cancel both NEXT and FEXT it is typically necessary to provide both inductive and capacitive compensation. The prior art arrangement of contact wires disclosed in FIGS. 1–3 has been proven to effectively and efficiently provide inductive differential to differential crosstalk compensation. However, it has been determined that this arrangement may be ineffective, and perhaps counterproductive, in providing inductive differential to common mode compensation in the jack 10. More specifically, the prior art arrangement provides inductive differential to differential crosstalk compensation between pairs 1 and 3, pairs 2 and 3, and pairs 4 and 3, but in the development of the present invention it has been recognized that, due to the large physical separation between the conductors of pair 3 and their asymmetric placement relative to pair 2 (and similarly to pair 4), the highest levels of differential to common mode crosstalk in a mating plug, which can be the most problematic to channel performance, tend to occur on pairs 2 and 4 when pair 3 is excited differentially. The differential to common mode crosstalk occurring when any of the pairs 1, 2 and 4 is excited differentially tends to be much less severe, and consequently much less problematic, because the separation between the conductors in each of these pairs is one-third the separation between the conductors of pair 3. In the prior art arrangement of contact wires disclosed in FIGS. 1–3, crossover on each of pairs 1, 2 and 4 inductively compensates for the less severe differential to common mode crosstalk occurring when any of these pairs is differentially excited. However, due to the absence of a crossover on pair 3, this arrangement not only fails to inductively compensate for the more severe common mode crosstalk on pairs 2 and 4 when pair 3 is differentially excited, but can actually exacerbate this problem. This is especially true when the jack receives a conventional plug such as the one illustrated in U.S. Pat. No. 6,250,949 to Lin.

Figure 4:
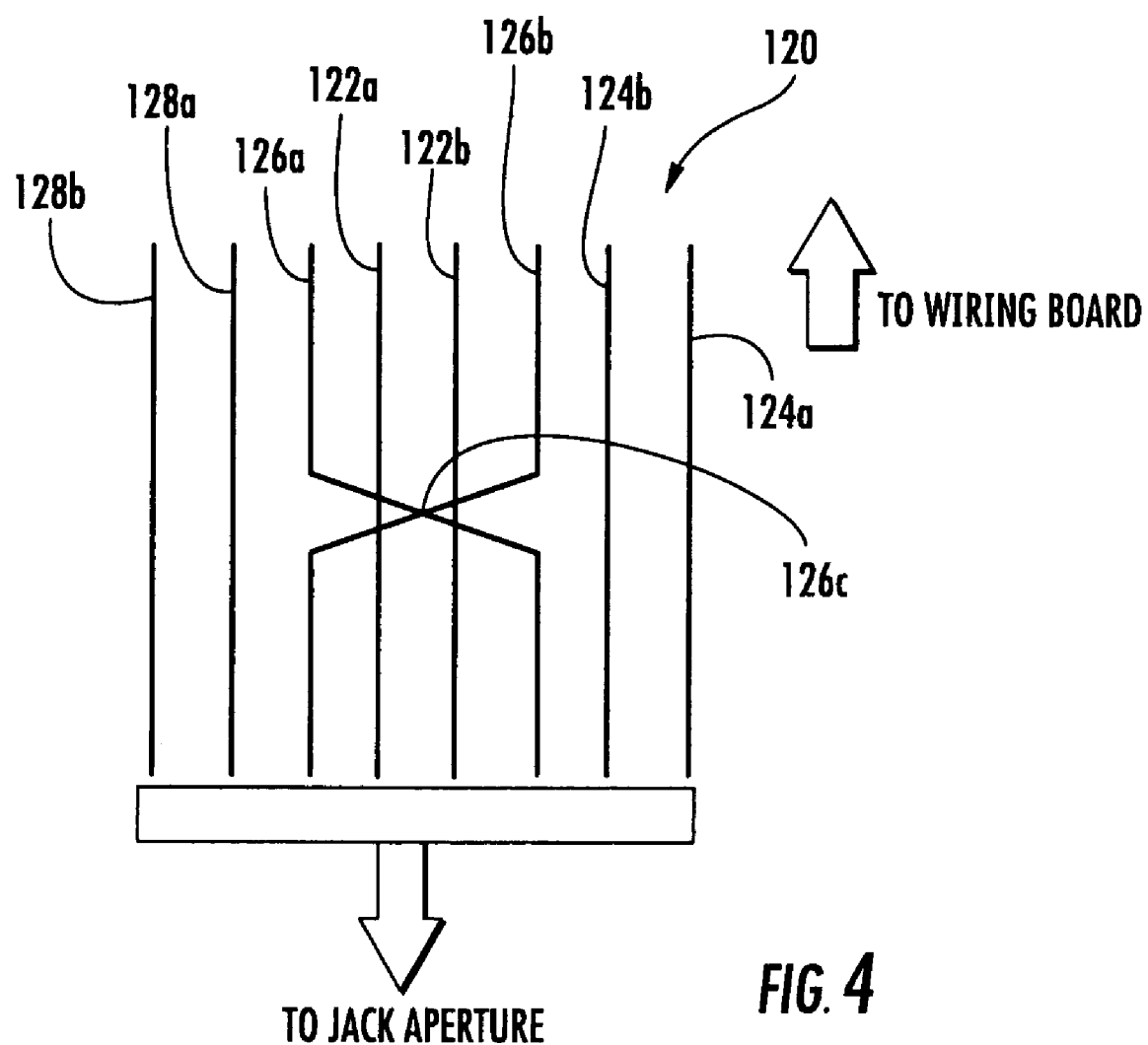
FIG. 4 is a top schematic view of contact wires of an embodiment of a communications jack according to the present invention.

Turning now to FIG. 4, an arrangement of wires according to embodiments of the present invention, designated broadly at 120, is illustrated schematically therein. The wiring arrangement 120 includes eight contact wires 122a, 122b, 124a, 124b, 126a, 126b, 128a, 128b that comprise, respectively, wire pairs 1, 2, 3 and 4. In contrast to the prior art arrangement of contact wires described above, in this embodiment the contact wires 122a, 122b of pair 1, the contact wires 124a, 124b of pair 2, and the contact wires 128a, 128b of pair 4 do not include a crossover, while the contact wires 126a, 126b include a crossover 126c.

Like the prior arrangement, this arrangement of contact wires should provide compensatory inductive differential to differential crosstalk between pairs 1 and 3, pairs 2 and 3, and pairs 4 and 3. In addition, this arrangement, although not inductively compensating for the less severe differential to common mode crosstalk occurring when any of the pairs 1, 2 and 4 is differentially excited, can provide inductive compensation for the highly problematic differential to common mode crosstalk occurring on pairs 2 and 4 when pair 3 is differentially excited. Because the most problematic differential to common mode crosstalk can be inductively compensated, a jack employing this arrangement can meet higher performance standards, particularly at elevated frequencies.

An exemplary implementation of this arrangement is illustrated in FIGS. 5–7A, in which a jack 200 according to embodiment of the present invention is shown. The jack 200 includes a jack frame 212 having a plug aperture 214, a cover 216 and a terminal housing 218. A wiring board 220 includes IDCs 242a–248b mounted thereon. Contact wires 222a–228b are mounted to the wiring board 220. At their free ends, the contact wires 222a–228b fit within slots 229a–229h located at the forward end of the wiring board 220 and are positioned to mate with the blades of a plug inserted into the plug aperture 214. With the exception of the crossover region 226c, described in greater detail below, the contact wires 222a–228b follow generally the same profile until they bend downwardly into their respective mounting apertures in the wire board 220. Conductive traces on the wiring board 220 provide signal paths between the contact wires 222a–228b and the IDCs 242a–248b.

Figure 5:
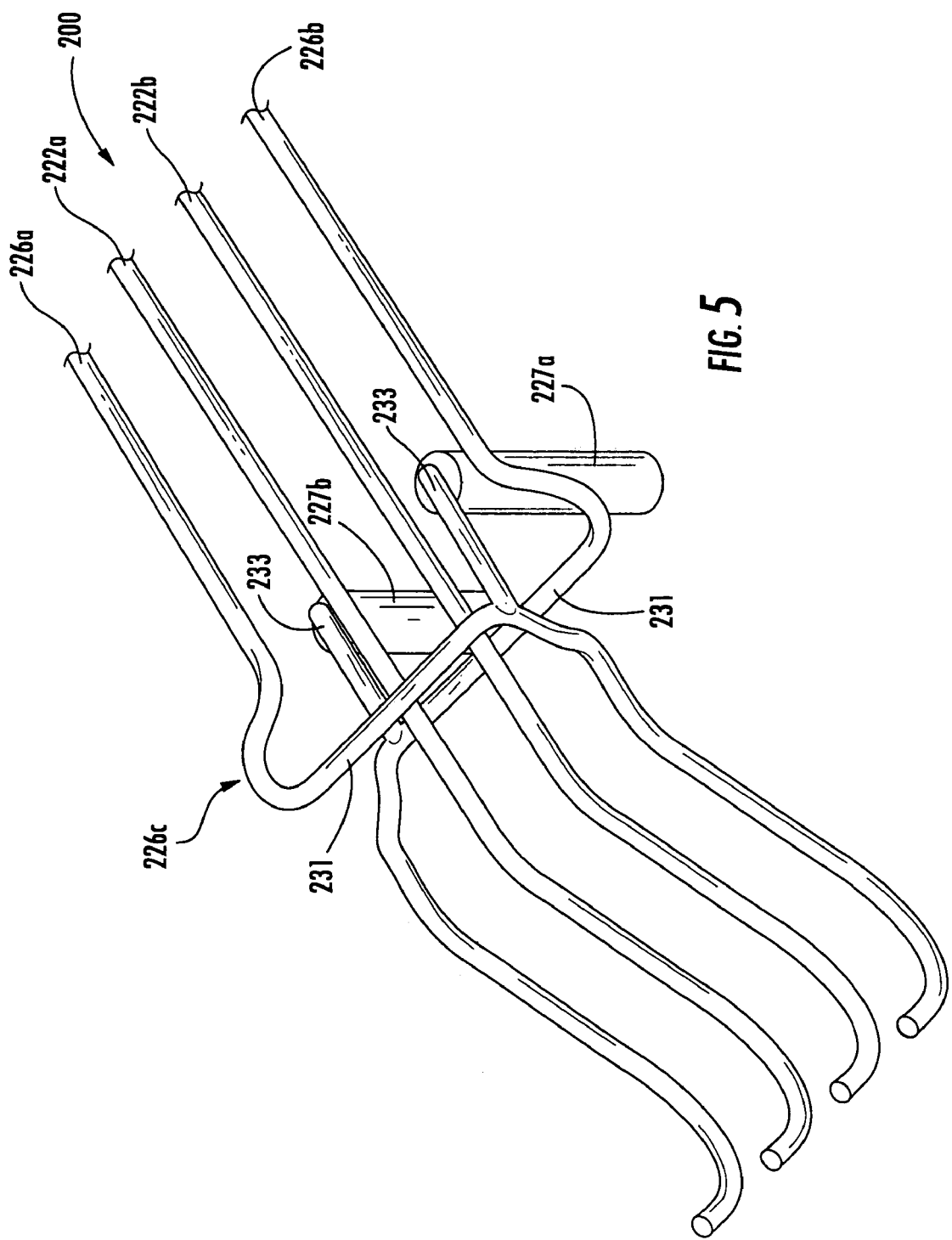
FIG. 5 is an enlarged perspective view of contact wires following the configuration illustrated in FIG. 4 according to embodiments of the present invention.
Figure 6:
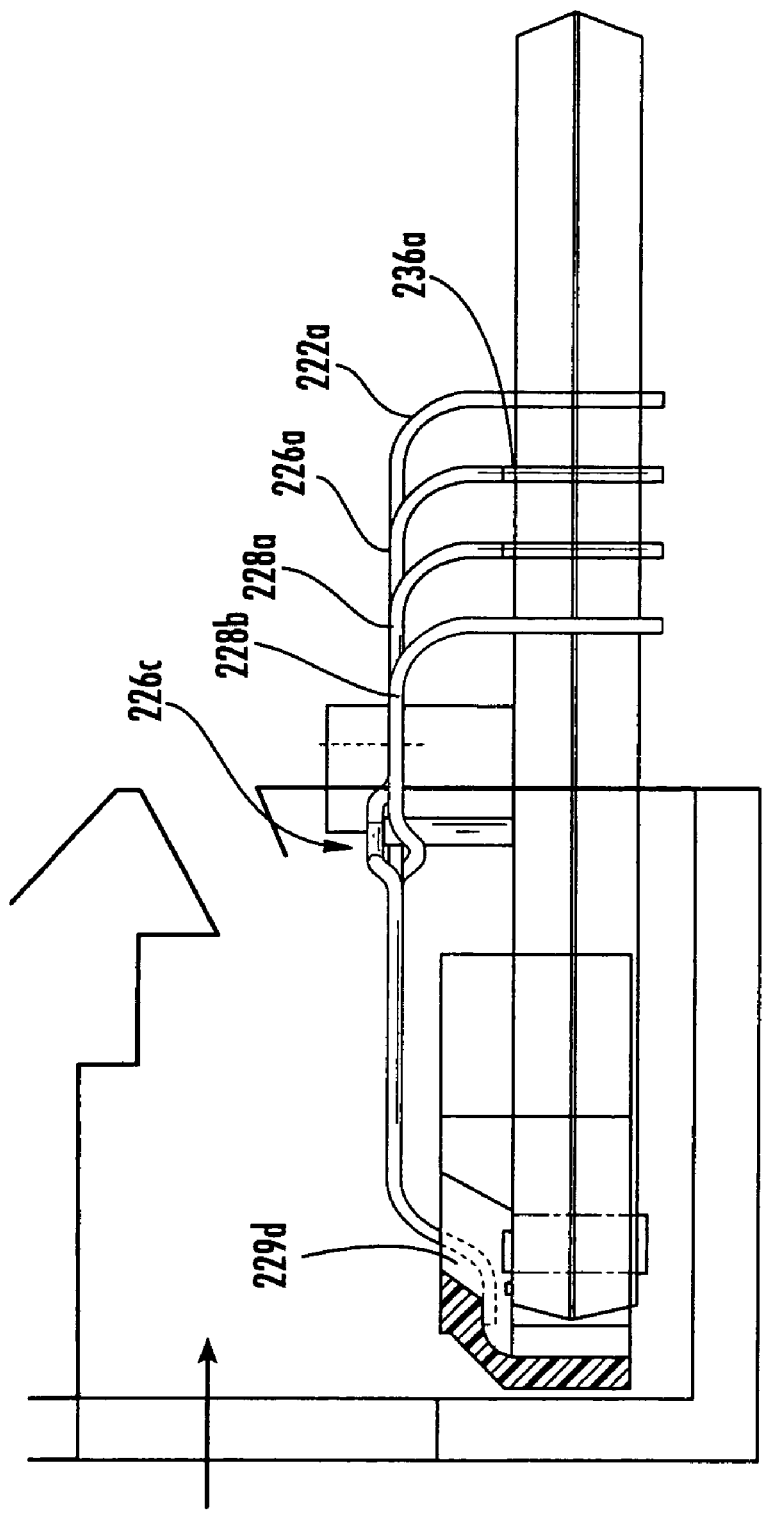
FIG. 6 is an enlarged side view of contact wires of FIG. 5 in a wiring board.
Figure 7:
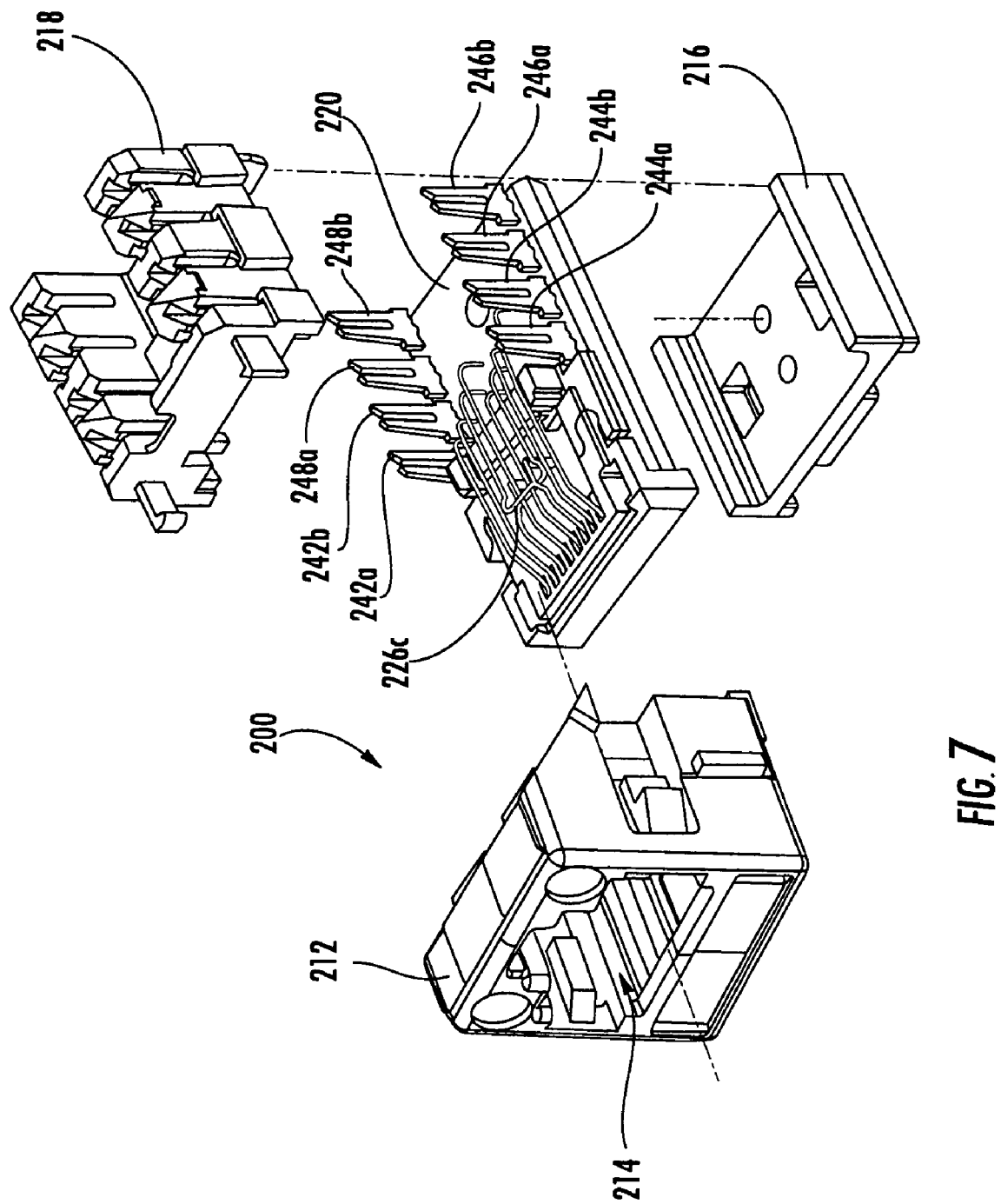
FIG. 7 is a perspective view of a communications jack that includes the contact wires of FIG. 5 according to embodiments of the present invention.
Figure 7A:
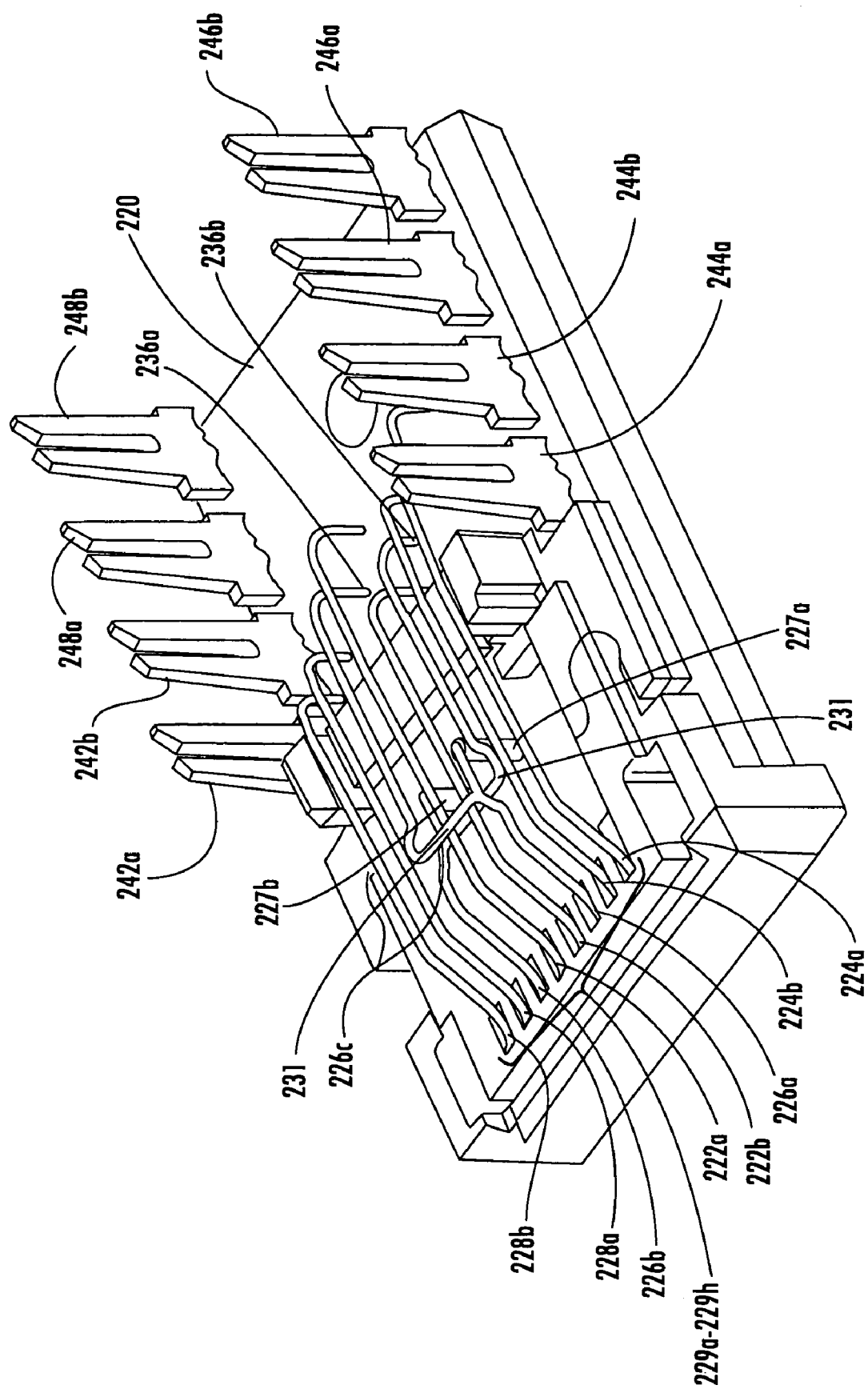
FIG. 7A is an enlarged perspective view of the communications jack of FIG. 7.
Figure 8A:
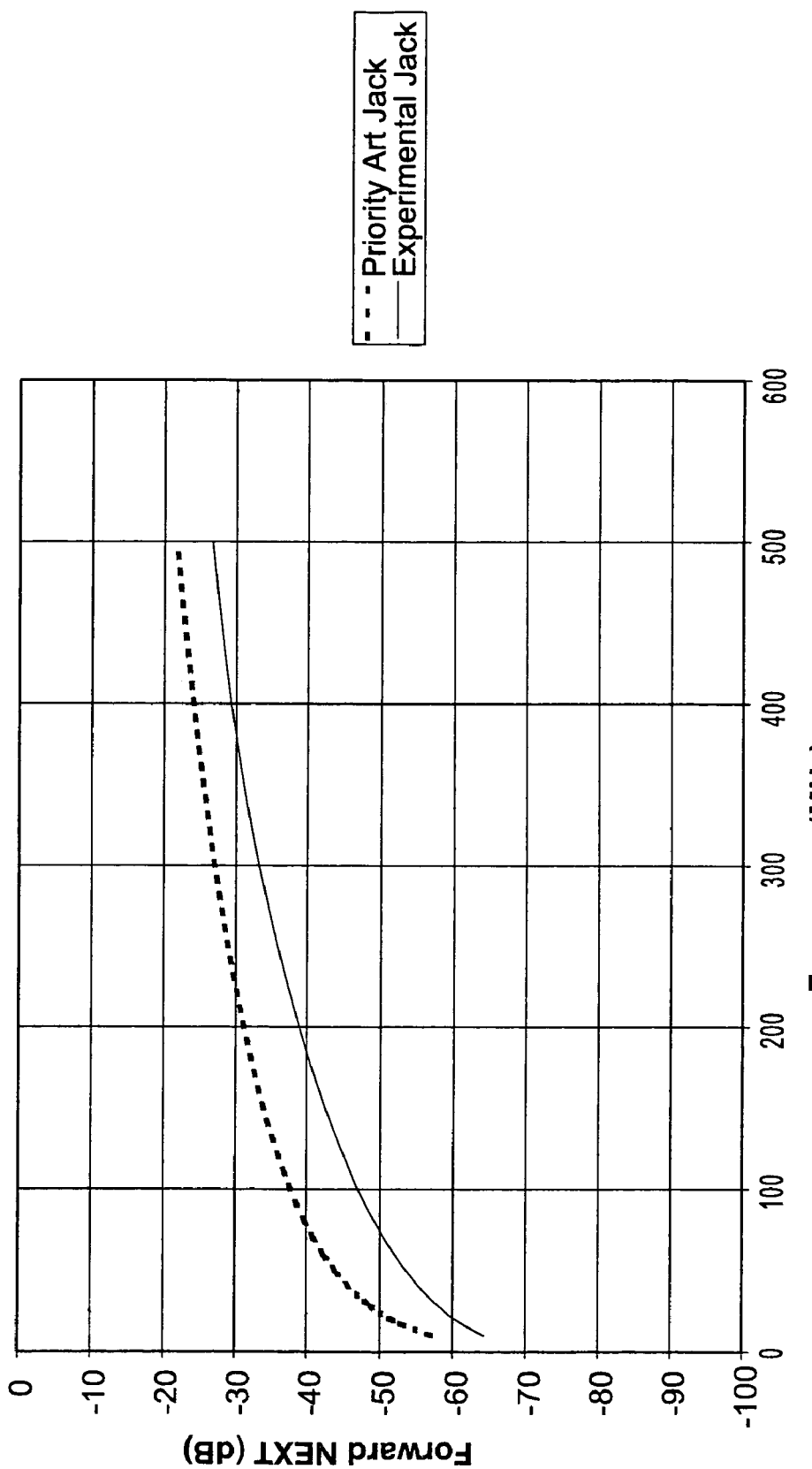
FIGS. 8A–8D are graphs plotting forward and reverse differential to common mode NEXT and FEXT as a function of frequency for pairs 3 and 2.
Figure 8B:
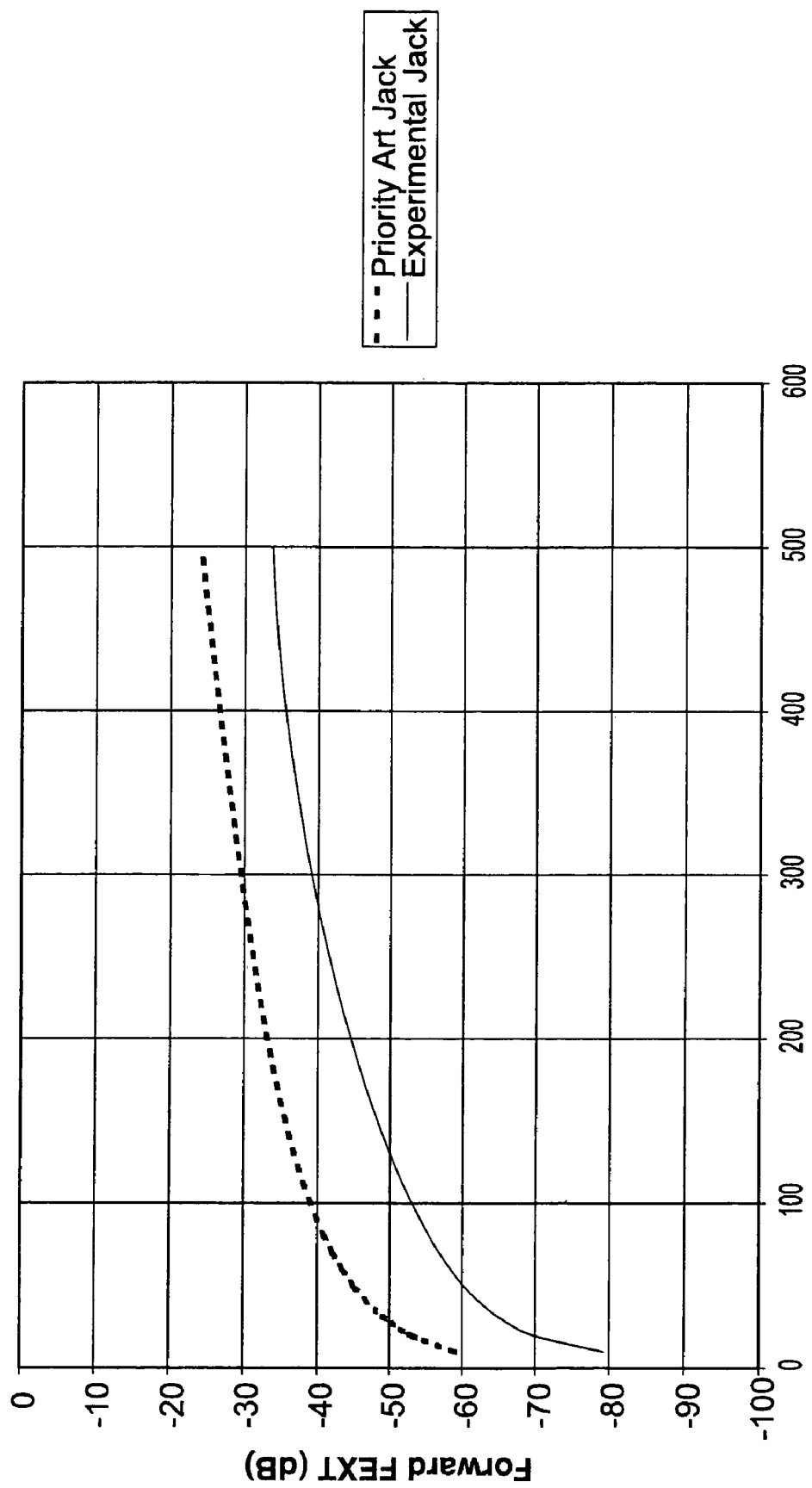
Figure 8C:
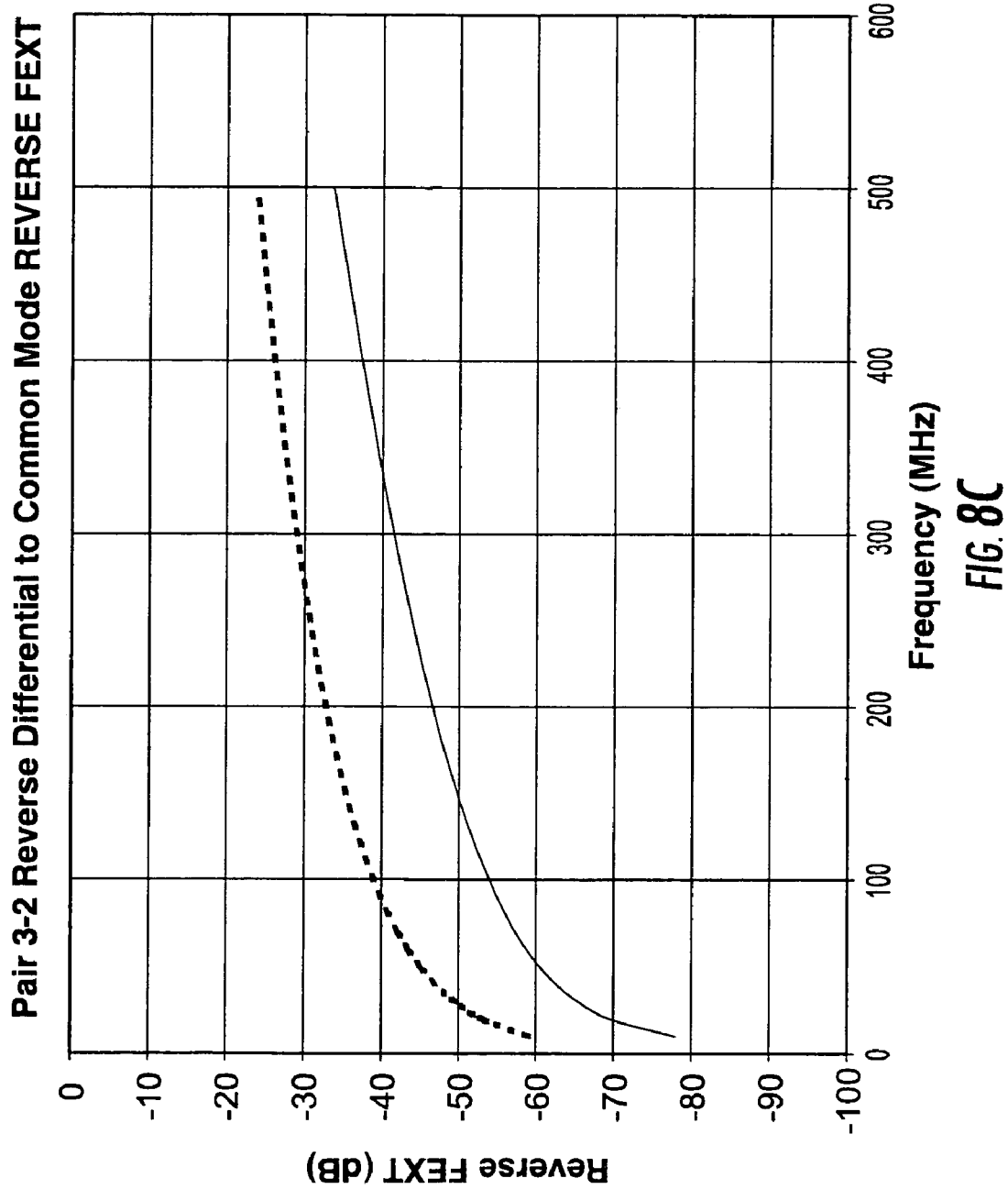
Figure 8D:
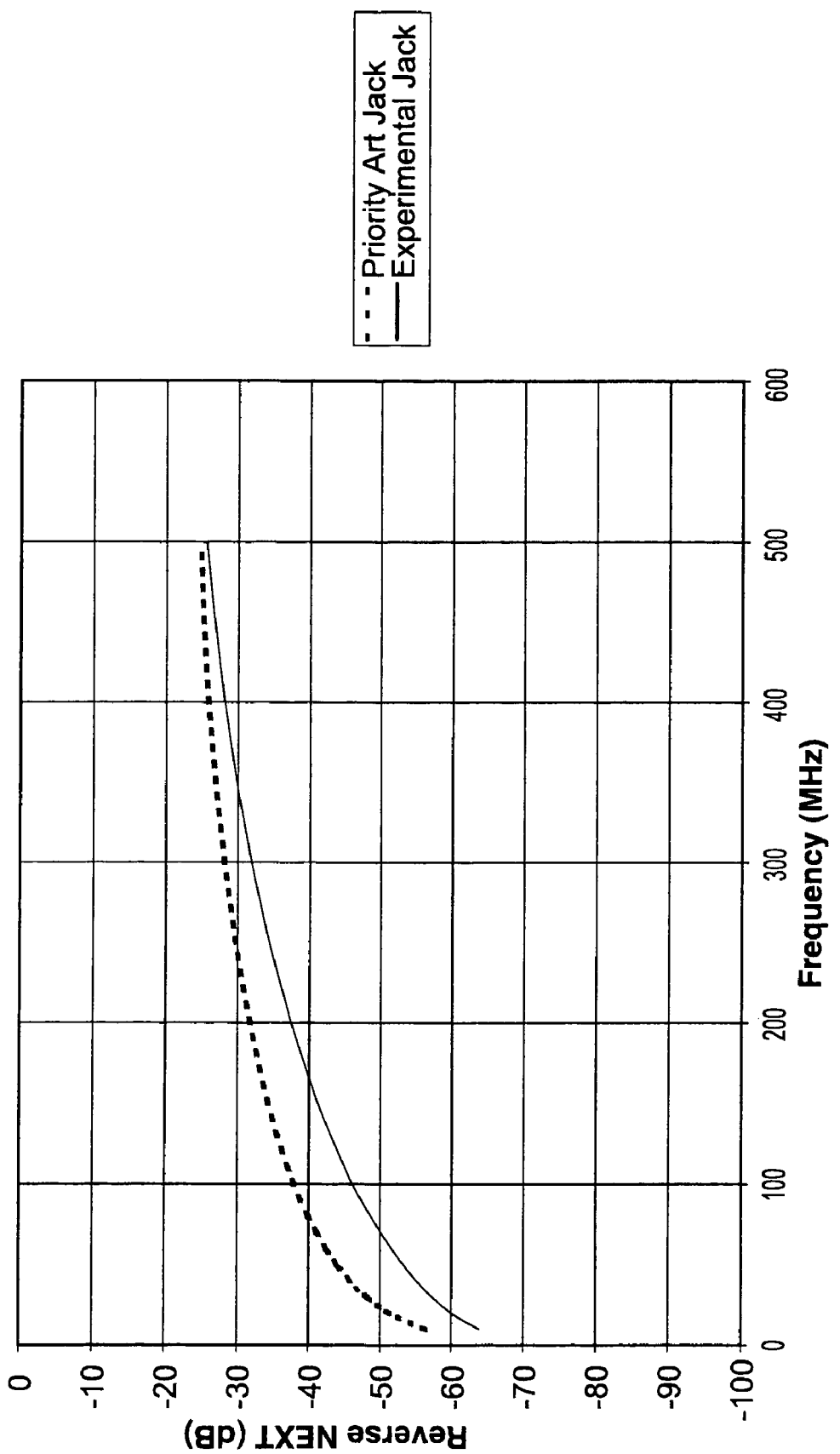
Figure 9A:
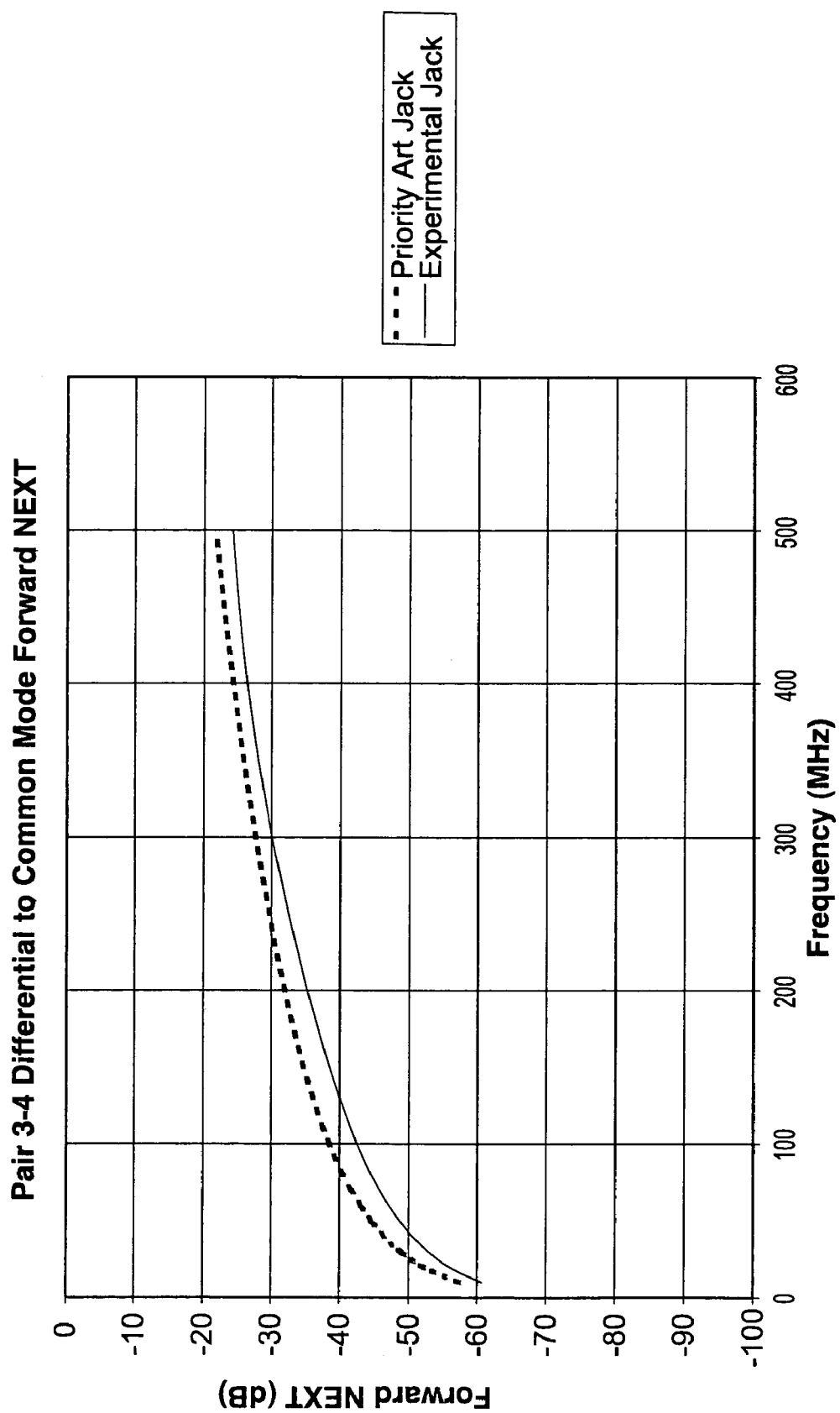
FIGS. 9A–9D are graphs plotting forward and reverse differential to common mode NEXT and FEXT as a function of frequency for pairs 3 and 4.
Figure 9B:
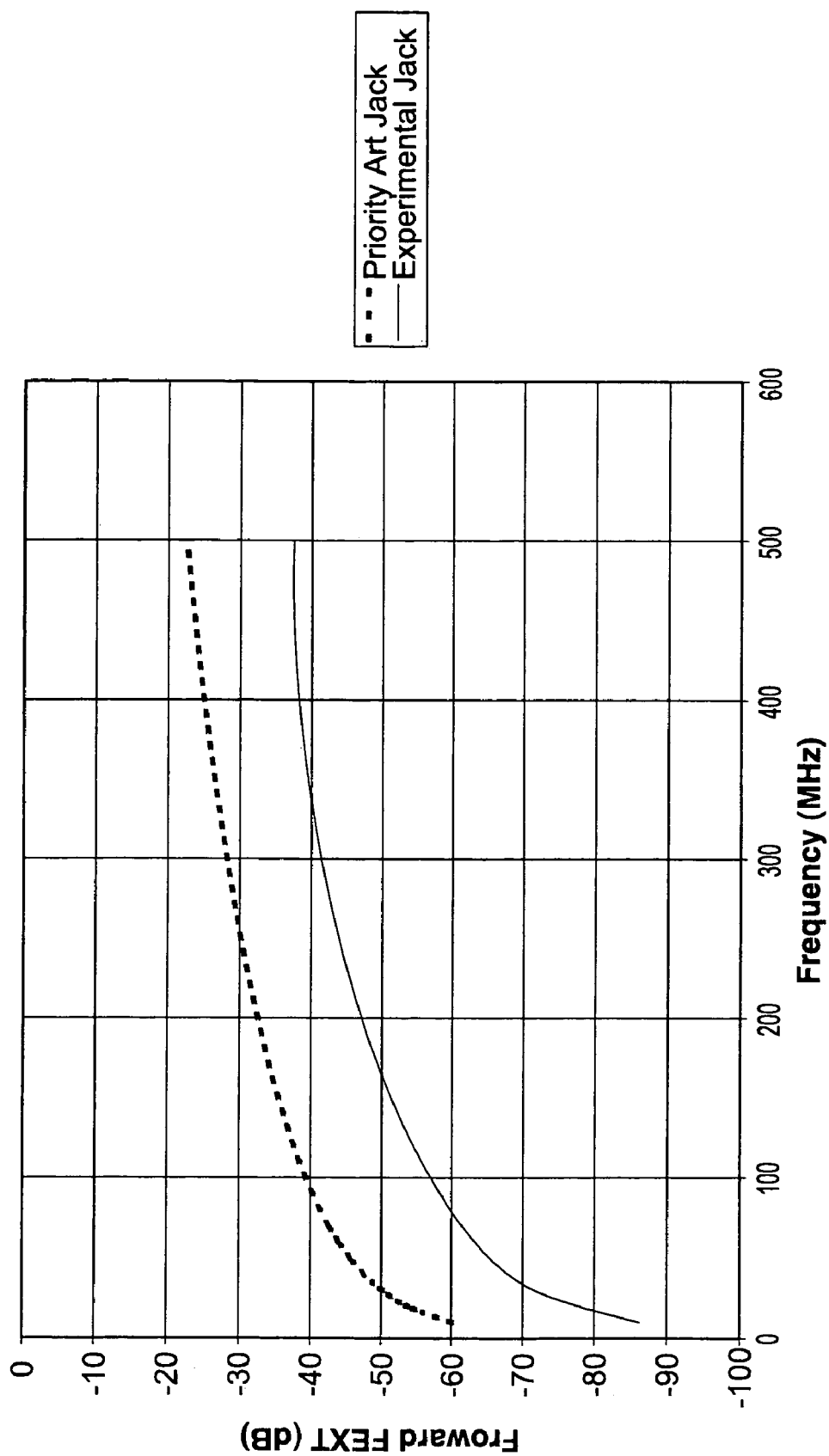
Figure 9C:
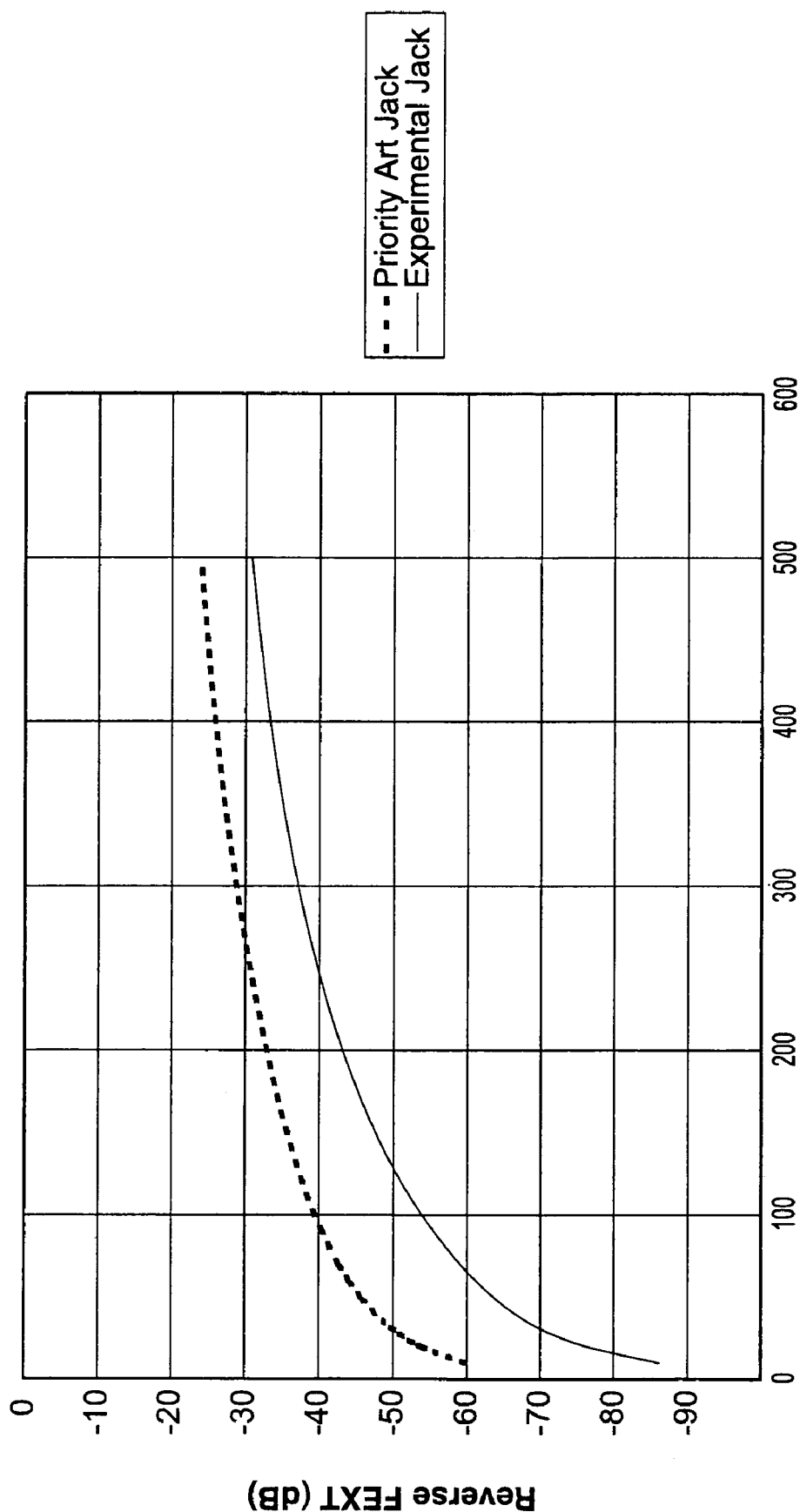
Figure 9D:
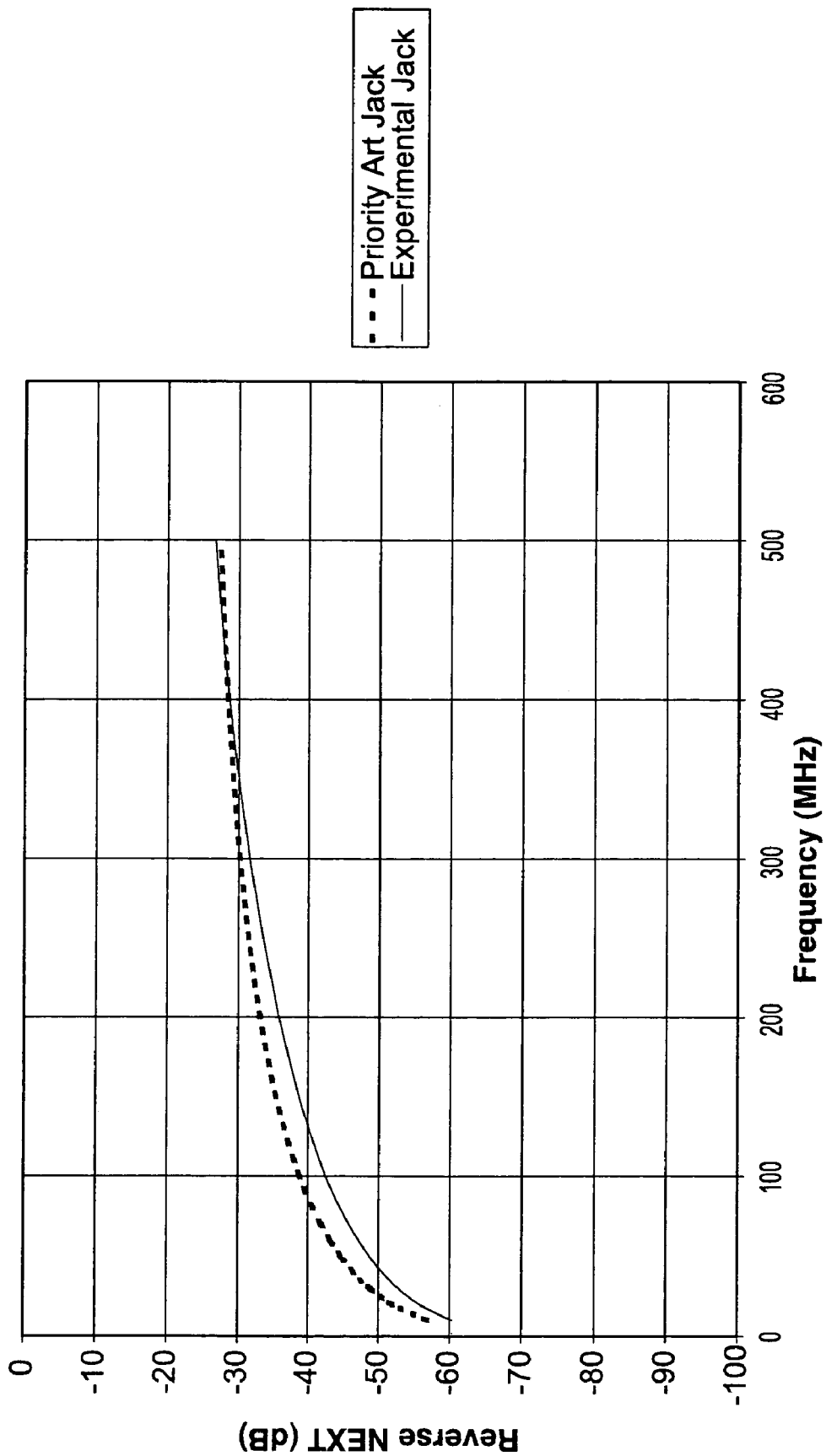

Referring now to FIG. 5, the contact wires 226a, 226b form the crossover 226c with the assistance of supports 227a, 227b. Each of the contact wires 226a, 226b includes a transversely-extending crossover segment 231 that travels either over (in the case of the contact wire 226a) or under (in the case of contact wire 226b) the contact wires 222a, 222b. Each of the contact wires 226a, 226b also includes a support finger 233 that extends rearwardly from the crossover segment 231 to rest atop a respective support 227a, 227b. The supports 227a, 227b extend upwardly from the wiring board 220 from locations approximately halfway between the free ends of the contact wires 226a, 226b and their mounting locations 236a, 236b in the wiring board 220. In some embodiments the support finger 233 of each contact wire 226a, 226b may extend from its crossover segment at substantially the same angle, such that the supports 227a, 227b are of different heights in order to support the crossover segment 231 of each contact wire 226a, 226b at the proper elevation. In other embodiments, the supports 227a, 227b may be of the same height, and the support finger 231 of each crossover segment may extend therefrom at different angles, or the supports may be of different heights and the fingers may extend at different angles.

This configuration enables the free ends of the contact wires 226a, 226b to deflect in response to the insertion of a plug in the plug aperture 214 without contacting the contact wires 222a, 222b. The illustrated embodiment has the advantage of enabling the commencement of the inductive differential to differential and differential to common mode compensations at minimal delay from the corresponding crosstalk sources, which can be important to effective crosstalk compensation. The separation between the crossover segments 231 and the locations where the contact wires 222a, 222b intercept a mating plug is about 0.154 inches, but those skilled in this art will appreciate that a separation gap of a different size may also be suitable with the present invention. Typically the contact wires are between about 0.648 and 0.828 inches in length, and the crossover 226c occurs between about 0.3 and 0.4 inches from the free ends of the contact wires 226a, 226b.

The skilled artisan will recognize that, although eight contact wires are illustrated and described herein, other numbers of contact wires may be employed. For example, 16 contact wires may be employed, and one or more crossovers that cross over a pair of contact wires sandwiched therebetween may be included in those contact wires.

Further, those skilled in this art will recognize that other jack configurations may also be suitable for use with the present invention. For example, as discussed above, other configurations of jack frames, covers and terminal housings may also be employed with the present invention. As another example, the contact wires may have a different profile (an exemplary alternative profile is depicted in U.S. Pat. No. 5,975,919 to Arnett et al.), or they may by replaced by conductive paths on a flexible circuit, and they may mount in locations that do not follow the "dual diagonal" mounting scheme illustrated herein (an exemplary alternative is illustrated in U.S. Pat. No. 6,116,964 to Goodrich et al). As a further example, the IDCs may mount in a different pattern on the wiring board, or some other type of connector may be used. Those skilled in this art will also recognize that embodiments of the wiring board described above may be employed in other environments in which a communications jack may be found. For example, jacks within a patch panel or series of patch panels may be suitable for use with such wiring boards. Other environments may also be possible. It may also be recognized that the contact wires may not include any crossovers on any of the pairs, but rather the wiring board to which they are attached can have its signal carrying conductive paths routed in accordance with the crossover scheme described generally in FIG. 4.

Moreover, those skilled in this art will further recognize that the crossover of pair 3 described above can be implemented, with similar beneficial effect on differential to common mode crosstalk conversion, by forming the conductor leads of jacks utilizing metallic lead-frame structures instead of printed wiring boards to achieve the required connectivity and crosstalk compensation. In such a configuration, the contact wires and/or the insulation displacement connectors may be formed integrally with the conductors as unitary members.

The configuration illustrated and described herein can provide connectors, and in particular communications jacks, that exhibit improved crosstalk characteristics, particularly at elevated frequencies. For example, a connector such as that illustrated in FIGS. 5–7A and mated with a conventional plug may have channel alien NEXT of less than −60 dB power sum at 100 MHz, and less than −49.5 dB power sum at 500 MHz.

Also those skilled in the art will recognize that in situations where it may not be critical to implement the differential to differential crosstalk compensation between pairs 3 and 2 and between pairs 3 and 4 in the contact wires, it is possible to provide instead compensation for the common mode crosstalk induced on pair 3, or pair 1, when either of pair 2 or pair 4 is differentially excited, by modifying the contact wire crossover scheme of FIG. 4 to include crossovers in pairs 2 and 4 in addition to the crossover on pair 3.

Further, those skilled in the art will recognize the reciprocity that exists between the differential to common mode crosstalk induced on a first pair, when a second pair is excited differentially, and the common mode to differential signal induced on the second of these pairs when the first of these pairs is excited common-modally, with the common mode to differential crosstalk equaling the differential to common mode crosstalk multiplied by a constant, that constant being the ratio of the differential to common mode impedances. Consequently, when an improvement occurs, due to the current invention, in the differential to common mode crosstalk between two pairs when one of these pairs is excited differentially, a corresponding improvement occurs in the common mode to differential crosstalk between these two pairs, when the other of these pairs is excited common-modally.

The invention is described in greater detail herein in the following non-limiting example.

EXAMPLE

Communication jacks of the configuration illustrated in FIG. 1, mated with conventional plugs, were modeled and solved using finite element electromagnetic field simulation software. In one jack model designated "experimental jack", the contact wire crossover configuration substantially matched the embodiment of the current invention illustrated in FIGS. 5–7A. In a second jack model, designated "prior art jack", the contact wire crossover configuration substantially matched the prior art jack illustrated in FIGS. 1–3. The jack models were then solved for differential to common mode NEXT and FEXT crosstalk.

Differential to Common Mode Results for the problematic 3-2 and 3-4 pair combinations, where pair 3 is the differentially excited pair, are shown in FIGS. 8A–8D and FIGS. 9A–9D. For each of these pair combinations results are provided for forward NEXT, forward FEXT, reverse FEXT and reverse NEXT, wherein the term "forward" represents the testing orientation in which the excitation is injected from the cordage end of the plug and term "reverse" represents the testing orientation in which the excitation is injected from building cable end of the jack. It can be seen that in all these cases the experimental jack employing the pair 3 crossover exhibited significant improvements in differential to common mode crosstalk (i.e. lower decibel levels) over the prior art jack, within the frequency band of interest of 10–500 MHz.

The foregoing is illustrative of the present invention and is not to be construed as limiting thereof. Although exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. The invention is defined by the following claims, with equivalents of the claims to be included therein.

That which is claimed is:

1. A wiring board for a communications jack, comprising:
   a dielectric mounting substrate;
   a plurality of contact wires mounted in the mounting substrate, each of the contact wires including a fixed end portion mounted in the mounting substrate;
   wherein a first pair of contact wires is sandwiched inside and in between a second pair of contact wires,
   wherein the plurality of contact wires is eight contact wires, and wherein a pair of contact wires is positioned laterally of each of the contact wires of the second pair,
   wherein the second pair of contact wires includes a crossover, the crossover being in a deflectable portion of the contact wires and the positioning of the crossover being selected to provide differential to common mode crosstalk compensation, and
   wherein only the second pair of contact wires includes a crossover.

2. The wiring board defined in claim 1, wherein a free end portion of each contact wire of the second pair is longitudinally aligned with the fixed end portion of the other contact wire of the second pair.

3. The wiring board defined in claim 1, wherein a crossover segment is present in each of the contact wires of the second pair, and wherein the crossover of the second pair comprises the crossover segments.

4. The wiring board defined in claim 3, wherein a support finger extends away from each crossover segment.

5. The wiring board defined in claim 4, wherein the mounting substrate includes a pair of supports extending upwardly therefrom, and wherein the support fingers are supported by the supports.

6. The wiring board defined in claim 5, wherein one of the supports has a height that is less than a height of the other support.

7. The wiring board defined in claim 3, wherein a first of the crossover segments passes over the first pair of contact wires, and a second of the crossover segments passes under the first pair of contact wires.

8. The wiring board defined in claim 1, wherein the contact wires of the first pair are between 0.648 and 0.828 inches in length, and wherein the crossover of the second pair is positioned between 0.3 and 0.4 inches from a the free end of at least one of the contact wires of the second pair.

9. The wiring board defined in claim 1, wherein the differential to common mode crosstalk at 500 MHz is lower than about −24 dB.

10. A wiring board for a communications jack, comprising:
    a dielectric mounting substrate;
    first, second, third and fourth pairs of contact wires mounted in the mounting substrate, each of the contact wires including a fixed end portion mounted in the mounting substrate and a free end portion;
    wherein the contact wires of the first pair of contact wires are immediately adjacent to each other and are sandwiched inside and in between the third pair of contact wires, the contact wires of the second pair are immediately adjacent to each other, the contact wires of the fourth pair are immediately adjacent to each other, and the second and fourth pairs sandwich the third pair; and
    wherein the third pair of contact wires includes a crossover, the crossover being in a deflectable portion of the contact wires and the positioning of the crossover being selected to provide differential to common mode crosstalk compensation;

wherein only the third pair of contact wires includes a crossover, and wherein a first contact wire of the third pair of contact wires only crosses the contact wires of the first pair of contact wires one time, and wherein a second contact wire of the third pair of contact wires only crosses the contact wires of the first pair of contact wires one time.

11. The wiring board defined in claim 10, wherein the free end portion of each wire of the second pair is aligned with the fixed end portion of the other wire of the second pair.

12. The wiring board defined in claim 10, wherein neither of the second and fourth pairs of contact wires includes a crossover.

13. The wiring board defined in claim 10, wherein each contact of the third pair includes a support finger.

14. The wiring board defined in claim 13, wherein the mounting substrate includes a pair of supports extending upwardly therefrom, and wherein the support fingers are supported by the supports.

15. The wiring board defined in claim 14, wherein one of the supports has a height that is less than the height of the other support.

16. A communications jack, comprising:
a jack housing having a plug aperture;
a wiring board;
a first contact wire and a second contact wire that form a first differential pair, the first and second contact wires each having a fixed portion that is mounted in the wiring board and a deflectable portion positioned in the plug aperture for electrical contact with a mating plug; and
a third contact wire and a fourth contact wire that form a second differential pair, the third and fourth contact wires each having a fixed portion that is mounted in the wiring board and a deflectable portion positioned in the plug aperture for electrical contact with the mating plug;
wherein at least a portion of the first differential pair of contact wires is sandwiched inside and in between the second differential pair of contact wires,
wherein the second differential pair of contact wires includes a crossover, and
wherein the crossover is located in the deflectable portions of the third and fourth contact wires and
wherein the third contact wire only crosses the first and second contact wires one time, and wherein the fourth contact wire only crosses the first and second contact wires one time.

17. The communications jack defined in claim 16, wherein the communications jack includes a third differential pair of contact wires and a fourth differential pair of contact wires, and wherein only the second differential pair of contact wires includes a crossover.

18. The communications jack defined in claim 16, wherein a support finger extends from the deflectable portion of at least one of the contact wires of the second differential pair of contact wires.

19. The communications jack defined in claim 18, wherein a segment of the third contact wire and a segment of the fourth contact wire cross the first differential pair of contact wires at an angle that is substantially normal to a primary axis of the first contact wire.

20. The communications jack defined in claim 16, wherein the crossover is located no more than about 0.2 inches from the contact region of the first contact wire.

21. A communications jack, comprising:
a jack housing having a plug aperture;
a wiring board that includes a plurality of conductive traces;
a first contact wire and a second contact wire that form a first differential pair, the first and second contact wires each having a deflectable portion positioned in the plug aperture for electrical contact with a mating plug, the first and second contact wires being electrically connected to respective ones of the plurality of conductive traces;
a third contact wire and a fourth contact wire that form a second differential pair, the third and fourth contact wires each having a deflectable portion positioned in the plug aperture for electrical contact with a mating plug, the third and fourth contact wires being electrically connected to respective ones of the plurality of conductive traces;
a fifth contact wire and a sixth contact wire that form a third differential pair, the fifth and sixth contact wires each having a deflectable portion positioned in the plug aperture for electrical contact with a mating plug, the fifth and sixth contact wires being electrically connected to respective ones of the plurality of conductive traces; and
a seventh contact wire and an eighth contact wire that form a fourth differential pair, the seventh and eighth contact wires each having a deflectable portion positioned in the plug aperture for electrical contact with a mating plug, the seventh and eighth contact wires being electrically connected to respective ones of the plurality of conductive traces;
wherein at least a portion of the first differential pair of contact wires is sandwiched inside the second differential pair of contact wires,
wherein the second differential pair of contact wires includes a crossover,
wherein the first, third and fourth differential pairs of contact wires do not include a crossover, and
wherein the crossover is immediately adjacent contact regions of the third and fourth contact wires, and
wherein the third contact wire only crosses the first and second contact wires one time, and wherein the fourth contact wire only crosses the first and second contact wires one time.

22. The communications jack defined in claim 21, wherein the crossover is located in a deflectable portion of the third and fourth contact wires.

23. A communications jack, comprising:
a jack housing having a plug aperture;
a flexible printed circuit board that includes a first conductive trace and a second conductive trace that form a first differential pair, and a third conductive trace and a fourth conductive trace that form a second differential pair, the first, second, third and fourth conductive traces having respective contact regions located within the plug aperture that are configured to make electrical contact with respective first, second third and fourth conductors of a mating plug; and
first, second, third and fourth output terminals that are electrically connected to respective of the first, second, third and fourth conductive traces, wherein the contact region of the third conductive trace is in between the contact regions of the first and fourth conductive traces, wherein the contact region of the fourth conductive trace is in between the contact regions of the second and third conductive traces, wherein the first and second conductive traces cross each other at a crossover location on the flexible printed circuit board, and wherein the third conductive trace only crosses the first and second conductive trace one time, and wherein the fourth conductive trace only crosses the first and second conductive trace one time.

24. The communications jack defined in claim 23, wherein a portion of the second conductive trace runs adjacent to the third conductive trace and a portion of the first conductive trace runs adjacent to the fourth conductive trace.

25. The communications jack defined in claim 23, wherein the crossover location is located in a deflectable portion of the first and second conductive traces.

26. The communications jack defined in claim 23, wherein the crossover location is located no more than about 0.2 inches from the contact region of the first contact wire.

27. The communications jack defined in claim 23, wherein the contact region of the first conductive trace is on a first side of the crossover location, and wherein a portion of the first conductive trace on a second side of the crossover location that is opposite the first side inductively couples with the fourth conductive trace.

28. The communications jack defined in claim 27, wherein the contact region of the second conductive trace is on a first side of the crossover location, and wherein a portion of the second conductive trace on a second side of the crossover location that is opposite the first side inductively couples with the third conductive trace.

29. The communications jack defined in claim 23, wherein the contact region of the first conductive trace is on a first side of the crossover location, wherein a portion of the first conductive trace on a second side of the crossover location that is opposite the first side runs adjacent to the fourth conductive trace, wherein the contact region of the second conductive trace is on a first side of the crossover location, and wherein a portion of the second conductive trace on a second side of the crossover location that is opposite the first side runs adjacent to the third conductive trace.

30. A communications jack, comprising:

a jack housing having a plug aperture;

a wiring board;

a first contact wire and a second contact wire that form a first differential pair, the first and second contact wires each having a fixed portion that is mounted in the wiring board and a deflectable portion positioned in the plug aperture for electrical contact with a mating plug;

a third contact wire and a fourth contact wire that form a second differential pair, the third and fourth contact wires each having a fixed portion that is mounted in the wiring board and a deflectable portion positioned in the plug aperture for electrical contact with the mating plug; and at least one support finger that supports one of the contact wires of the second differential pair of contact wires, wherein at least a portion of the first differential pair of contact wires is sandwiched inside and in between the second differential pair of contact wires, wherein the second differential pair of contact wires includes a crossover, wherein a fixed end of the support finger is mounted in a location separate from the locations where the fixed portions of the third and fourth contact wires are mounted in the wiring board, and wherein the support finer is part of the one of the contact wires of the second differential pair of contact wires and is supported by a support that extends upwardly from the wiring board.

* * * * *